US012426468B2

(12) United States Patent
Kim et al.

(10) Patent No.: US 12,426,468 B2
(45) Date of Patent: Sep. 23, 2025

(54) ORGANIC LIGHT EMITTING DIODE DEVICE

(71) Applicant: LG Display Co., Ltd., Seoul (KR)

(72) Inventors: Mi-Seong Kim, Paju-si (KR); Se-Jong Yoo, Paju-si (KR); Kyoung-Mook Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 161 days.

(21) Appl. No.: 17/679,061

(22) Filed: Feb. 23, 2022

(65) Prior Publication Data

US 2022/0190046 A1    Jun. 16, 2022

Related U.S. Application Data

(62) Division of application No. 16/578,695, filed on Sep. 23, 2019, now Pat. No. 11,296,156.

(30) Foreign Application Priority Data

Nov. 28, 2018  (KR) .................. 10-2018-0149489
Dec. 4, 2018   (KR) .................. 10-2018-0154485
Dec. 28, 2018  (KR) .................. 10-2018-0172125

(51) Int. Cl.
  *H01L 35/24*    (2006.01)
  *H01L 27/32*    (2006.01)
  (Continued)

(52) U.S. Cl.
  CPC ........... *H10K 59/35* (2023.02); *H10K 50/805* (2023.02); *H10K 59/1213* (2023.02);
  (Continued)

(58) Field of Classification Search
  CPC .. H10K 59/40; H10K 50/805; H10K 59/1213; H10K 59/122; H10K 59/35;
  (Continued)

(56) References Cited

U.S. PATENT DOCUMENTS 8,367,444 B2   2/2013   Kim et al.
9,252,395 B2   2/2016   Oh
(Continued)

FOREIGN PATENT DOCUMENTS

CN   103794631 A   5/2014
CN   103811675 A   5/2014
(Continued)

OTHER PUBLICATIONS

Office Action issued Sep. 28, 2023 for counterpart Korean Patent Application No. 10-2018-0149489.
(Continued)

*Primary Examiner* — Ajay Ojha
*Assistant Examiner* — Tsz K Chiu
(74) *Attorney, Agent, or Firm* — Morgan, Lewis & Bockius LLP

(57) ABSTRACT

An inorganic light emitting diode device includes: a substrate including a plurality of sub-pixels; a thin film transistor (TFT) in each of the plurality of sub-pixels, wherein the TFT has at least one inorganic layer; an encapsulation layer on an organic light emitting layer, wherein the encapsulation layer includes at least one organic encapsulation layer and at least one inorganic encapsulation layer; and an opening exposing the inorganic layer of the TFT, wherein the opening connects the at least one inorganic encapsulation layer with the inorganic layer of the TFT.

26 Claims, 16 Drawing Sheets

(51) Int. Cl.
  *H01L 51/00*    (2006.01)
  *H01L 51/52*    (2006.01)
  *H10K 50/805*   (2023.01)
  *H10K 59/121*   (2023.01)
  *H10K 59/122*   (2023.01)
  *H10K 59/35*    (2023.01)
  *H10K 59/40*    (2023.01)
  *H10K 59/80*    (2023.01)
  *H10K 102/00*   (2023.01)
  *H10K 102/10*   (2023.01)

(52) U.S. Cl.
  CPC .......... *H10K 59/122* (2023.02); *H10K 59/40* (2023.02); *H10K 59/8723* (2023.02); *H10K 59/8731* (2023.02); *H10K 59/805* (2023.02); *H10K 2102/103* (2023.02); *H10K 2102/311* (2023.02)

(58) Field of Classification Search
  CPC ....... H10K 2102/103; H10K 2102/311; H10K 50/844; H10K 77/111; H10K 59/8723; H10K 50/84; H01L 27/3246; H01L 27/3283; H01L 27/3295; H01L 27/3274
  See application file for complete search history.

(56) References Cited

U.S. PATENT DOCUMENTS

| | | | |
|---|---|---|---|
| 9,450,038 B2 | 9/2016 | Kwon et al. | |
| 9,929,370 B2 | 3/2018 | Nakamura | |
| 10,109,700 B2* | 10/2018 | Jang | H10K 59/80522 |
| 10,115,782 B2 | 10/2018 | Tada et al. | |
| 10,263,211 B2* | 4/2019 | Byun | H10K 59/1213 |
| 10,347,702 B2 | 7/2019 | Youn et al. | |
| 10,379,417 B2 | 8/2019 | Oka et al. | |
| 10,451,908 B2 | 10/2019 | Jin et al. | |
| 10,529,274 B2 | 1/2020 | Sasaki | |
| 10,707,280 B2* | 7/2020 | Jeong | H10K 50/86 |
| 11,960,676 B2* | 4/2024 | Park | G06F 3/0446 |
| 11,977,697 B2* | 5/2024 | Im | G06F 3/0443 |
| 12,086,368 B2* | 9/2024 | Gwon | G06F 3/0445 |
| 2001/0011868 A1 | 8/2001 | Fukunaga | |
| 2002/0024493 A1 | 2/2002 | Ozawa | |
| 2002/0158835 A1 | 10/2002 | Kobayashi et al. | |
| 2003/0129790 A1 | 7/2003 | Yamazaki et al. | |
| 2009/0015153 A1 | 1/2009 | Asano | |
| 2011/0220901 A1* | 9/2011 | Ha | H10K 50/8426 257/59 |
| 2014/0117341 A1 | 5/2014 | Song et al. | |
| 2014/0131682 A1 | 5/2014 | Kim et al. | |
| 2015/0041779 A1 | 2/2015 | Park et al. | |
| 2015/0060806 A1* | 3/2015 | Park | H10K 59/122 257/40 |
| 2015/0185942 A1 | 7/2015 | Kim et al. | |
| 2016/0118451 A1 | 4/2016 | Youn et al. | |
| 2016/0126494 A1* | 5/2016 | Jung | H10K 59/8791 438/23 |
| 2016/0126496 A1 | 5/2016 | Wang et al. | |
| 2017/0077195 A1 | 3/2017 | Seo et al. | |
| 2017/0123543 A1 | 5/2017 | Choi et al. | |
| 2017/0148859 A1* | 5/2017 | Nishinohara | H10K 50/841 |
| 2017/0179432 A1 | 6/2017 | Visweswaran et al. | |
| 2017/0196101 A1 | 7/2017 | Ki et al. | |
| 2017/0256596 A1 | 9/2017 | Hamada et al. | |
| 2017/0271619 A1 | 9/2017 | Sumita | |
| 2017/0308212 A1* | 10/2017 | Jin | H10K 59/131 |
| 2017/0331073 A1 | 11/2017 | Choi et al. | |
| 2018/0033832 A1* | 2/2018 | Park | G06F 3/0446 |
| 2018/0083229 A1 | 3/2018 | Tsuruoka | |
| 2018/0113531 A1 | 4/2018 | Na | |
| 2018/0130972 A1 | 5/2018 | Sonoda et al. | |
| 2018/0337224 A1 | 11/2018 | Aoki | |
| 2019/0095007 A1 | 3/2019 | Jeong et al. | |
| 2019/0155430 A1* | 5/2019 | Hwang | G06F 3/0416 |
| 2019/0157607 A1 | 5/2019 | Kim et al. | |
| 2020/0194721 A1 | 6/2020 | Lee | |
| 2020/0409485 A1* | 12/2020 | Gwon | H10K 59/8731 |
| 2021/0193754 A1* | 6/2021 | Han | H10K 59/131 |
| 2021/0201711 A1* | 7/2021 | Yun | H10K 50/8426 |
| 2021/0335955 A1* | 10/2021 | Son | H10K 59/122 |
| 2021/0408211 A1* | 12/2021 | Lim | H10K 59/131 |

FOREIGN PATENT DOCUMENTS

| | | |
|---|---|---|
| CN | 103811675 B | 6/2016 |
| CN | 107146803 A | 9/2017 |
| JP | 2007-234572 A | 9/2007 |
| JP | 5791514 B2 | 10/2015 |
| JP | 2017-168348 A | 9/2017 |
| KR | 10-2015-0135721 A | 12/2015 |
| KR | 10-2016-0053356 A | 5/2016 |
| KR | 10-2016-0054867 A | 5/2016 |
| KR | 10-2016-0149599 A | 12/2016 |
| KR | 10-2017-0127603 A | 11/2017 |
| KR | 10-2018-0043528 A | 4/2018 |
| WO | 2016/63367 A1 | 10/2016 |
| WO | 2016/163367 A1 | 10/2016 |

OTHER PUBLICATIONS

Office Action issued in corresponding Korean Intellectual Property Application No. 10-2018-0172125, dated Sep. 5, 2023.
First Office Action issued in corresponding Chinese Patent Application No. 201911147652.7, dated Mar. 1, 2023.
Official Notice dated Dec. 23, 2020, issued in corresponding Taiwanese Patent Application No. 108143188. Note: U.S. Pat. No. 20150041779 cited therein is already of record.
Notice of Reasons for Rejection dated Nov. 24, 2020, issued in corresponding Japanese Patent Application No. 2019-215337.
Extended European Search Report dated May 18, 2020, issued in corresponding European Patent Application No. 19210556.7.

* cited by examiner

ORGANIC LIGHT EMITTING DIODE DEVICE

This application is a divisional of U.S. patent application Ser. No. 16/578,695, filed Sep. 23, 2019, and claims priority from and the benefit of Korean Patent Application Nos. 10-2018-0149489, 10-2018-0154485, and 10-2018-0172125 filed on Nov. 28, 2018, Dec. 4, 2018, and Dec. 28, 2018, respectively, all of which are hereby incorporated by reference in their entirety for all purposes as if fully set forth herein.

BACKGROUND

Technical Field

The present disclosure relates to an organic light emitting diode (OLED) device.

Discussion of the Related Art

With the advent of an information-oriented society, as interest in information displays for processing and displaying a massive amount of information and demand for portable information media have increased, the display field has rapidly advanced. Thus, various light and thin flat panel display devices have been developed. Among the flat panel display devices, an organic light emitting diode (OLED) display is a self-luminescent type display and does not require a backlight unit as used in a liquid crystal display (LCD), which is not a non-self luminescent display. As a result, the OLED display is lightweight, and has a thin profile.

In addition, the OLED display has advantages in viewing angle, contrast ratio, and power consumption, compared to the LCD. Furthermore, the OLED display may be driven with a low direct current (DC) voltage and may have rapid response speed. Moreover, because inner elements of the OLED display have solid phases, the OLED display has high durability against an external impact and has a wide available temperature range. Specifically, because the OLED display is manufactured through a simple process, manufacturing costs may be reduced as compared with the conventional LCD. Therefore, a blexible OLED, which maintains a display performance even though it is bent like a paper, has been researched.

The flexible OLED uses a thin film transistor (TFT) substrate made of a plastic material, not a glass material, and may be categorized into an unbreakable display having a high durability, a bendable display, a rollable display, and/or a foldable display. The flexible OLED display has advantages in use of space, interior decoration and design, and may be applied in various fields. Recently, to realize an ultra-thin and/or lightweight profile, and large-sized display area, a flexible OLED display that is portable in a folded state and displays images in an unfolded state, has been researched. The flexible OLED may be applied to various devices, for example, a mobile device, such as a mobile phone, ultra-mobile PC, electronic book, or electronic newspaper, TV, and/or monitor. However, due to repetitive folding of the flexible OLED display, an organic light emitting layer may be detached (or peeled off), and a reliability of the OLED display may be degraded. Further, when impurities, such as external moisture and air permeate the OLED display, the OLED display is defected and its lifetime is reduced.

A touch display, in which a screen is touched by a user's hand or object to input a user's instruction, has been widely used. The touch display may be categorized into an add-on type, an on-cell type and an in-cell type. Regarding the add-on type touch display, a display panel and a touch panel may be separately manufactured, and then the touch panel is attached on the display panel. Regarding the on-cell type touch display, elements constituting a touch panel may be directly formed on an upper substrate of a display panel. Regarding the in-cell type touch display, a touch panel is embedded in a display panel, and the touch display has advantages of thin profile and low surface reflection of external light. The touch type display is applied to an OLED display so that the OLED display senses and processes a touch input. Further, to sense a touch input in a flexible OLED display, a configuration of elements constituting a touch panel in the flexible OLED display has been researched.

SUMMARY

Accordingly, the present disclosure is directed to providing an organic light emitting diode device that substantially obviates one or more of the above-identified problems due to limitations and disadvantages of the related art.

An aspect of the present disclosure is to provide an OLED device that can relieve a compressive stress and a tensile stress applied thereto, can suppress a detachment of an organic light emitting layer and improve adhesion of an organic light emitting layer, and can achieve excellent reliability.

Another aspect of the present disclosure is to provide an OLED device that can minimize or reduce a destruction by a continuous and repetitive stress due to bending, and can prevent permeation of impurities, such as external moisture and air.

Another aspect of the present disclosure is to provide an OLED device that can process a touch input, and can have a structure that reduces a thickness of the device and a size of a bezel region and is thus applied suitably to a flexible OLED device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, there is provided a flexible organic light emitting diode (OLED) device comprising: a substrate including a plurality of sub-pixels, each of the plurality of sub-pixels including a driving TFT; an inter-layered insulating layer covering the driving TFT; an overcoat layer on the inter-layered insulating layer; a first electrode on the overcoat layer and in each of the plurality of sub-pixels; a bank covering an edge portion of the first electrode; an organic light emitting layer on the first electrode; a second electrode on the organic light emitting layer; and a protection film on the second electrode, wherein a location of a first hole is based on a location of the bank, and is in at least one of the overcoat layer, the bank, and the protection film.

Additionally, there is provided an organic light emitting diode (OLED) device comprising: a substrate including a plurality of sub-pixels; a thin film transistor (TFT) in each of the plurality of sub-pixels, wherein the TFT has at least one inorganic layer; an encapsulation layer on an organic light emitting layer, wherein the encapsulation layer includes at least one organic encapsulation layer and at least one inorganic encapsulation layer; and an opening exposing the inorganic layer of the TFT, wherein the opening connects the at least one inorganic encapsulation layer with the inorganic layer of the TFT.

Additionally, there is provided a flexible organic light emitting diode (OLED) device, comprising: a substrate including a plurality of sub-pixels, each of the plurality of sub-pixels including a driving TFT; an inter-layered insulating layer covering the driving TFT; an overcoat layer on the inter-layered insulating layer; a first electrode on the overcoat layer and in each of the plurality of sub-pixels; a bank covering an edge portion of the first electrode; an organic light emitting layer on the first electrode; a second electrode on the organic light emitting layer; and a protection film on the second electrode, wherein the protection film includes at least one inorganic layer, wherein a location of a first hole is based on a location of the bank, and exposes at least one of the overcoat layer, the bank, and the protection film, and a location of a second hole is based on the location of the first hole.

Additionally, there is provided a foldable organic light emitting diode (OLED) device comprising: a substrate including a plurality of sub-pixels; and a flat region, including: a first thin film transistor (TFT) in each sub-pixel in the flat region; a first insulating layer and a second insulating layer that are on the first TFT and are entirely over the substrate; a first light emitting element on the second insulating layer; and a first inorganic encapsulation layer, a first organic encapsulation layer, and a third inorganic encapsulation layer that are sequentially located on the first light emitting element and are over entire sub-pixels of the flat region; and a folding region, including: a second TFT in each sub-pixel in the flat region; an opening in the second insulating layer, thereby exposing the first insulating layer therebelow; a second light emitting element on the second insulating layer; a third inorganic encapsulation layer on the second light emitting element and extending to a side surface of the opening to encapsulate the second light emitting element; a second organic encapsulation layer in an island shape that is on the third inorganic encapsulation layer over the second light emitting element; and a fourth inorganic encapsulation layer on the third inorganic encapsulation layer and extending to the side surface of the opening, thereby encapsulating the third inorganic encapsulation layer, wherein a region of a part of the opening is exposed between the fourth inorganic encapsulation layer of one sub-pixel of the folding region, and the fourth inorganic encapsulation layer of an adjacent sub-pixel of the folding region.

Additionally, there is provided an organic light emitting diode (OLED) device, comprising: a first substrate; a thin film transistor (TFT) on the first substrate; a passivation layer covering the TFT; and an encapsulation layer on the passivation layer, wherein an encapsulation hole is in the encapsulation layer to expose a part of the passivation layer, and wherein a touch electrode is on the exposed part of the passivation layer, and is connected to a drain electrode of the TFT or a first signal line on the first substrate.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1A:
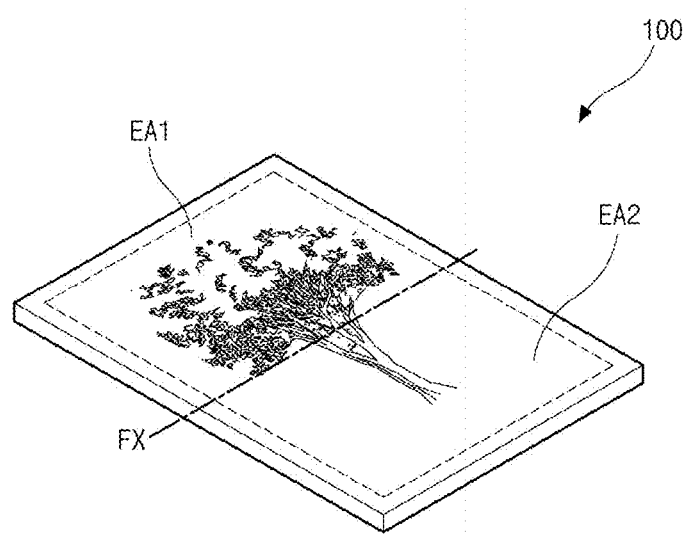
FIGS. 1A to 1C illustrate a folded state and an unfolded state of a flexible OLED device according to an example embodiment of the present disclosure.

Reference will now be made in detail to example embodiments, which may be illustrated in the accompanying drawings. Wherever possible, the same reference numbers will be used throughout the drawings to refer to the same or like parts. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case which is not continuous may be included unless a more limiting term, such as "just," "immediate(ly)," or "direct(ly)," is used. It will be understood that, although the terms like "first," "second," etc., may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified. The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified. Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship. Reference will now be made in detail to example embodiments of the disclosure, which are illustrated in the accompanying drawings. Wherever possible, the same reference numbers will be used throughout the drawings to refer to the same or like parts.

Figure 1B:
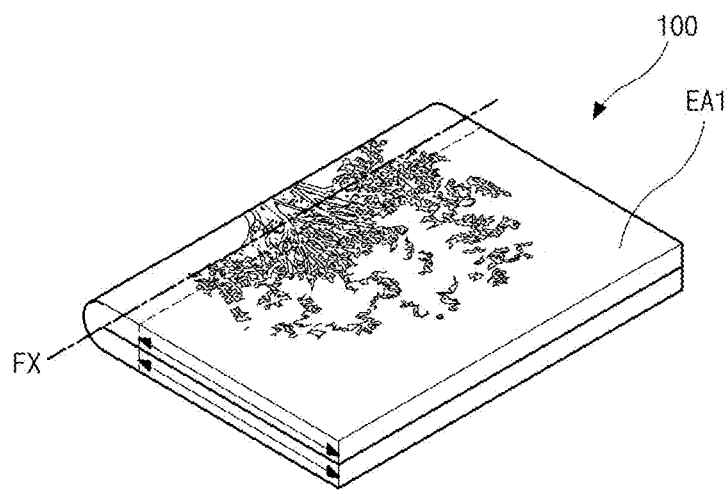
Figure 1C:
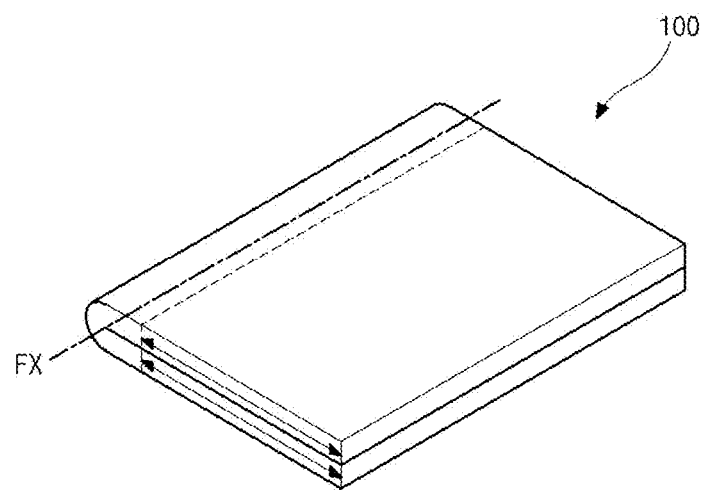

FIGS. 1A to 1C illustrate a folded state and an unfolded state of a flexible OLED device according to an example embodiment of the present disclosure. In this example embodiment, a foldable OLED device is described as a flexible OLED device 100. This example embodiment may be applied to other type OLED devices, for example, a curved OLED device, a bendable OLED device, a rollable OLED device, and/or a stretchable OLED device.

The flexible OLED device 100 may be used for a large-sized electronic device, such as a TV, an exterior advertising board, a small- and/or medium-sized electronic device. Such an electronic device may be a mobile phone, a personal computer, a laptop computer, a personal digital terminal, a vehicle navigator, a game console, a portable electronic device, a wristwatch-style electronic device, and/or a camera. As illustrated in FIG. 1A, the flexible OLED device 100 may include a plurality of regions that may be defined on a device surface and separated from each other. The flexible OLED device 100 may include first and second display regions EA1 and EA2 that may be divided from each other with respect to a folding axis FX, and display respective images. As illustrated in FIG. 1B, as the second display region EA2 is rotated clockwise around the folding axis FX, the flexible OLED device 100 may be in an outer folding state such that the first and second display regions EA1 and EA2 face away from each other, e.g., face in opposite outer directions.

As illustrated in FIG. 1C, as the second display region EA2 is rotated counterclockwise around the folding axis FX, the flexible OLED device 100 may be in an inner folding state such that the first and second display regions EA1 and EA2 face each other. The above flexible OLED device 100 of this example embodiment may be extremely folded both inwardly and outwardly, may prevent a detachment of an light emitting diode (e.g., E of FIG. 3), and may prevent permeation of external moisture and substance into the OLED device 100. As a result, reduction of a reliability of the flexible OLED device 100 may be prevented.

Figure 2:
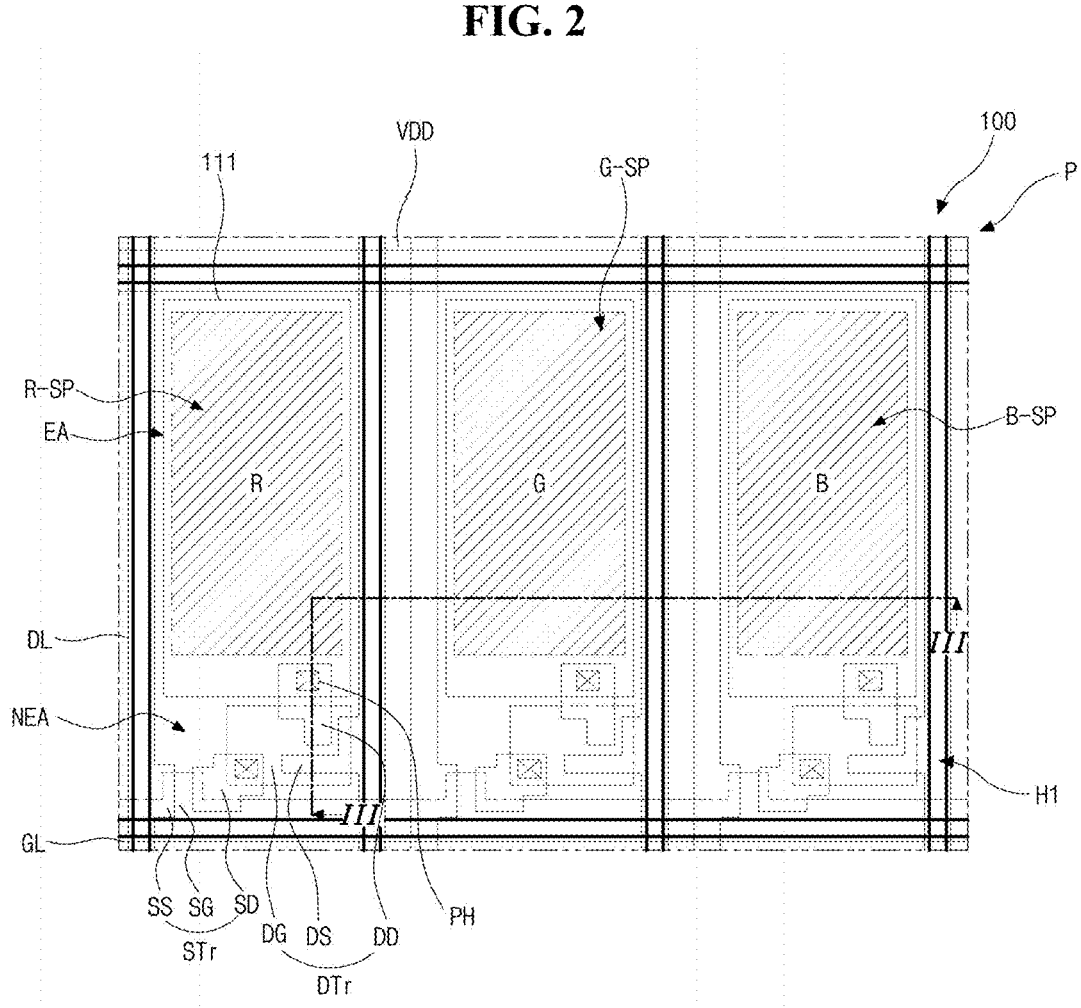
FIG. 2 illustrates a structure of a unit pixel including three sub-pixels in a flexible OLED device according to a first example embodiment of the present disclosure.
Figure 3:
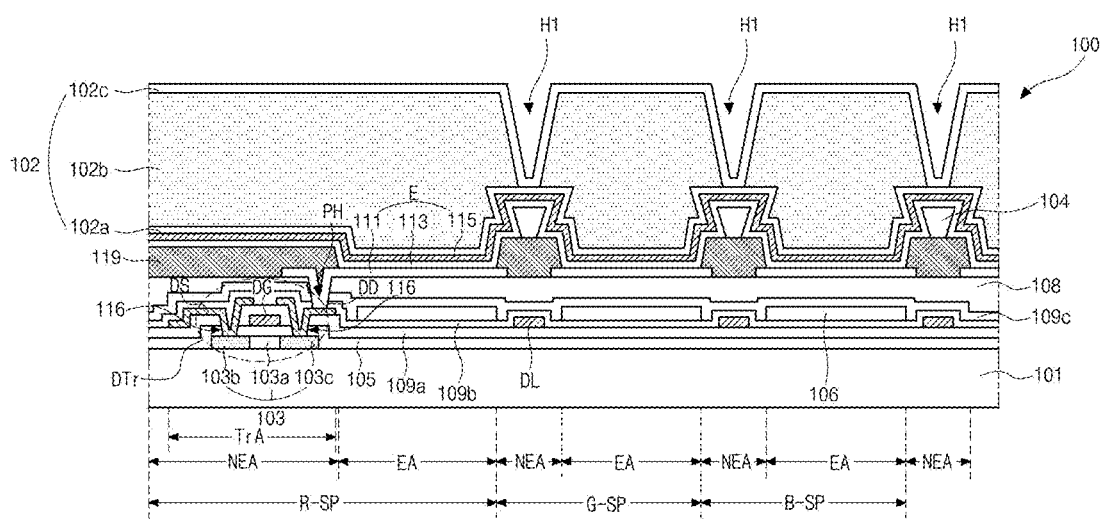
FIG. 3 is a cross-sectional view along a line of FIG. 2.
Figure 4A:
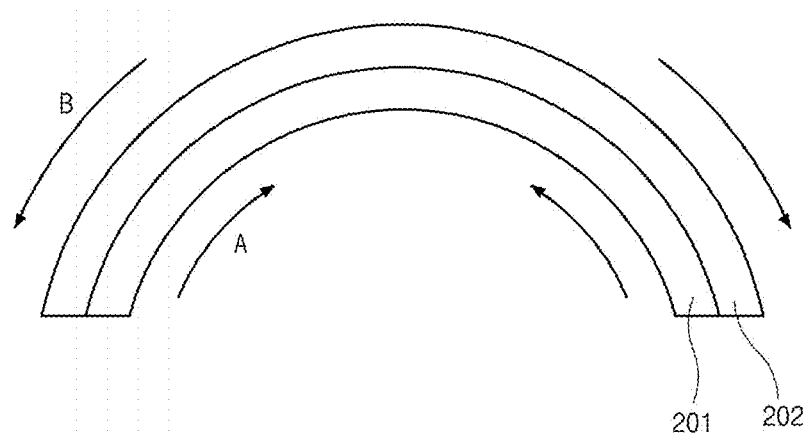
FIGS. 4A and 4B illustrate a principle of an applied stress being relieved in a bending work.
Figure 4B:
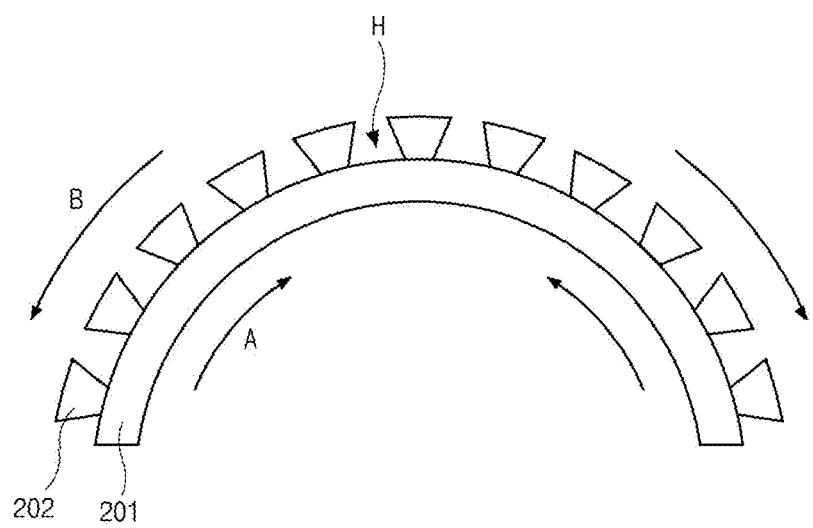

FIG. 2 illustrates a structure of a unit pixel including three sub-pixels in a flexible OLED device according to a first example embodiment of the present disclosure. FIG. 3 is a cross-sectional view along a line of FIG. 2. FIGS. 4A and 4B illustrate a principle of an applied stress being relieved in a folding work. The flexible OLED device 100 may be categorized into a top emission type or a bottom emission type according to a transmission direction of an emitted light. The bottom emission type is described by way of example.

As illustrated in FIG. 2, a unit pixel P of the flexible OLED device 100 may include three sub-pixels R-SP, G-SP, and B-SP. Each sub-pixel may include an emission region EA, and a non-emission region NEA that may be defined along a peripheral portion of the emission region EA. A bank 119 may be located at the non-emission region NEA. Red, green and blue sub-pixels R-SP, G-SP, and B-SP may be arranged in parallel with the same width. Alternatively, the sub-pixels R-SP, G-SP, and B-SP may have different configurations with different widths.

A switching thin film transistor (TFT) STr and a driving TFT DTr may be formed at a portion of the non-emission region NEA of each sub-pixel. At the emission region EA of each sub-pixel, a light emitting diode E including a first electrode 111, an organic light emitting layer 113, and a second electrode 115 may be formed. The switching TFT STr and the driving TFT DTr may be connected to each other, and the driving TFT DTr may be connected to the light emitting diode E. A gate line SL, a data line DL, and a power line VDD may be arranged on a substrate 101 to define each of the sub-pixels R-SP, G-SP, and B-SP.

The switching TFT STr may be formed at the crossing portion of the corresponding gate line GL and the corresponding data line DL, and may function to select the corresponding sub-pixel. The switching TFT STr may include a gate electrode SG branching off from the gate line SL, a semiconductor layer 103, a source electrode SS, and a drain electrode SD. The driving TFT DTr may operate the light emitting diode E of the sub-pixel selected by the corresponding switching TFT STr. The driving TFT DTr may include a gate electrode DG connected to the drain electrode SD of the switching TFT STr, a semiconductor layer 103, a source electrode DS connected to the power line VDD, and a drain electrode DD.

The drain electrode DD of the driving TFT DTr may be connected to the first electrode 111 of the light emitting diode E. The organic light emitting layer 113 may be interposed between the first and second electrodes 111 and 115. The organic light emitting layer 113 of each of the sub-pixels R-SP, G-SP, and B-SP may emit the same white light. For example, in the flexible OLED device 100, the organic light emitting layer 113 may not be formed of different light emitting materials emitting different colors respectively corresponding to the sub-pixels R-SP, G-SP, and B-SP, but may be formed of a light emitting material emitting the same white light corresponding to all of the sub-pixels R-SP, G-SP, and B-SP.

A shadow mask process of forming different light emitting materials respectively corresponding to the sub-pixels R-SP, G-SP, and B-SP may be omitted. Accordingly, problems caused by the shadow mask process may be prevented, and a high resolution may be effectively achieved. Further, a color change caused by a difference between degradation rates of different light emitting materials may be prevented. As further illustrated in FIG. 3, the semiconductor layer 103 may be located at a switching region TrA of the non-emission region NEA of each sub-pixel. The semiconductor layer 103 may be made of silicon, may include an active region 103a as a channel at a center portion thereof, and may include source and drain regions 103b and 103c highly doped with impurities and located at both sides of the active region 103a. A gate insulating layer 105 may be formed on the semiconductor layer 103. The gate electrode DG may be formed on the gate insulating layer 105 corresponding to the active region 103a. The gate line GL extending along a direction may be formed on the gate insulating layer 103.

A first inter-layered insulating layer 109a may be located on the gate electrode DG and the gate line GL. The first inter-layered insulating layer 109a and the gate insulating layer 105 may include first and second semiconductor contact holes 116 exposing the source and drain regions 103b and 103c, respectively. The source and drain electrodes DS and DD may be formed on the first inter-layered insulating layer 106a and spaced apart from each other. The source and drain electrodes DS and DD may contact the source and drain regions 103b and 103c through the first and second semiconductor contact holes 116, respectively.

A second inter-layered insulating layer 109b may be formed on the source and drain electrodes DS and DD, and the first inter-layered insulating layer 106a. The source and drain electrodes DS and DD, the semiconductor layer 103, and the gate electrode DG and the gate insulating layer 105 on the semiconductor layer 103 may form the driving TFT DTr. Even though not illustrated in FIG. 3, the switching TFT STr may have substantially the same structure as the driving TFT DTr and be connected to the driving TFT DTr.

In this example embodiment, the driving TFT DTr and the switching TFT STr having a coplanar structure (or top gate structure) with the semiconductor layer 103 formed as a polycrystalline silicon layer or oxide semiconductor layer is described by way of example. Alternatively, one or both of the driving TFT DTr and the switching TFT STr may have a bottom gate structure with the semiconductor layer 103 formed as an amorphous silicon layer. The substrate 101 may be made of a transparent plastic material, for example, polyimide, having a bendable property. In this regard, considering that a high-temperature deposition process is conducted on the substrate 101, a polyimide having a high thermal resistance may be used. At least one buffer layer may be formed on an entire surface of the substrate 101.

The driving TFT DTr in the switching region TrA may have a property of a threshold voltage being shifted by a light, and to prevent this, the flexible OLED device 100 may further include a light shielding layer located below the semiconductor layer 103. The light shielding layer may be formed between the substrate 101 and the semiconductor layer 103 to shield the active layer 111 from a light incident toward the semiconductor layer 103 through the substrate 100, and thus a threshold voltage change of a TFT by an external light may be minimized, prevented, or reduced. The light shielding layer may be covered by the buffer layer.

A wavelength conversion layer 106 may be formed on the second inter-layered insulating layer 109b corresponding to the emission region EA of each sub-pixel. The wavelength conversion layer 106 may include a color filter that transmits a wavelength of a color light, which may be set (or defined) at each sub-pixel, out of a white light emitted from the light emitting diode E toward the substrate 101. For example, the wavelength conversion layer 106 may transmit a wavelength of red, green or blue. For example, the red sub-pixel R-SP may include a red color filter, the green sub-pixel G-SP may include a green color filter, and the blue sub-pixel B-SP may include a blue color filter. Alternatively, the wavelength conversion layer 106 may include a quantum dot that has a size to re-emit according to a white light emitted from the light emitting diode E toward the substrate 101 and output a light of a color set at each sub-pixel.

The quantum dot may be selected from CdS, CdSe, CdTe, ZnS, ZnSe, CdZnSeS, GaAs, GaP, GaAs—P, Ga—Sb, InAs, InP, InSb, AlAs, AlP, and/or AlSb. For example, the wavelength conversion layer 106 of the red sub-pixel R-SP may include a quantum dot of CdSe or InP, the wavelength conversion layer 106 of the green sub-pixel G-SP may include a quantum dot of CdZnSeS, and the wavelength conversion layer 106 of the blue sub-pixel B-SP may include a quantum dot of ZnSe. The flexible OLED device 100 using the wavelength conversion layer 106 with a quantum dot may have a high color reproduction range. Alternatively, the wavelength conversion layer 106 may be formed of a color filter containing a quantum dot. Accordingly, the red, green and blue sub-pixels R-SP, G-SP, and B-SP may emit red, green, and blue lights, respectively, and thus the flexible OLED device 100 may display a full color image with a high brightness.

Further, the unit pixel P of the flexible OLED device 100 may further include a white sub-pixel. The white sub-pixel does not include any wavelength conversion layer. A third inter-layered insulating layer 109c may be formed on the wavelength conversion layer 106. An overcoat layer 108 may be formed on the third inter-layered insulating layer 109c. The overcoat layer 108 and the second and third inter-layered insulating layers 109b and 190c may have a drain contact hole PH exposing the drain electrode DD of the driving TFT DTr. Each of the first to third inter-layered insulating layers 109a, 109b and 109c may be made of an inorganic insulating material, for example, silicon nitride (SiNx) or silicon oxide ($SiO_2$). The overcoat layer 108 may be made of an organic insulating material, e.g., photo acryl, to compensate for a step caused by the switching and driving TFTs STr and DTr and/or the data line DL to make a surface planarization.

The first electrode 111 may be formed on the overcoat layer 108. The first electrode 111 may be connected to the drain electrode DD of the driving TFT DT and may serve as an anode of the light emitting diode E. The first electrode 111 may be made of a metal oxide material such as ITO and/or IZO, a mixture of a metal and an oxide material such as ZnO:Al and $SnO_2$:Sb, and/or a conductive polymer such as Poly(3-methylthiophene), Poly[3,4-(ethylene-1,2)-thiophene] (PEDT), polypyrrole, and/or polyaniline. Alternatively, the first electrode 111 may be formed of a carbon nano tube (CNT), graphene, and/or a silver nano wire. The first electrodes 111 may be located individually at the respective sub-pixels R-SP, G-SP, and B-PS, and the bank 119 may be located between the first electrodes 111 of the sub-pixels R-SP, G-SP, and B-PS. For example, the first electrodes 111 may be separate from each other with the bank 119 as a boundary portion of each pixel region SP.

The flexible OLED device 100 may include a spacer 104 that may be located on the bank 119 and may have an inverted taper shape. This spacer 140 may be referred to as an inverted spacer 104. The inverted spacer 104 may serve to buffer an empty space between the substrate 101 and the protection film 102 and thus minimize or reduce the amount of the flexible OLED device 100 that is damaged by an external impact. Particularly, as the spacer 104 may be formed to have the inverted taper shape, the spacer 104 may function to relieve a bending stress to one or more layers including the organic light emitting layer 113 in a work of folding the flexible OLED device 100.

The organic light emitting layer 113 may be located on the first electrode 111 and the inverted spacer 104. The second electrode 115 may be located entirely on the organic light emitting layer 113 and may serve as a cathode. The first electrode 111, the organic light emitting layer 113, and the second electrode 115 may form the light emitting diode E. By the inverted spacer 104, a deposited (or adhered) area of the organic light emitting layer 113 and the second electrode 115 located over the inverted spacer 104 may increase. Accordingly, an adhesion force of the organic light emitting layer 113 and the second electrode 115 may be improved. Further, as an adhered area of the protection film 102 may also increase, this may result in an effect of fixing the organic light emitting layer 113. Accordingly, even though a bending stress may be applied, a detachment of the organic light emitting layer 113 may be prevented. Further, even though a bending stress may be applied and a detachment of the organic light emitting layer 113 goes on, the inverted spacer 104 may block a spread of the detachment. As a result, the detachment of the organic light emitting layer 113 may be minimized or reduced.

The organic light emitting layer 113 may be formed with a single layer made of an emitting material. Alternatively, to increase an emission efficiency, the organic light emitting layer 113 may be formed with multiple layers that may include a hole injection layer, a hole transport layer, an emitting material layer, an electron transport layer and an electron injection layer. The second electrode 115 may be made of a metal material having a relatively low work function to serve as a cathode. For example, the second electrode 115 may be made of an alloy of magnesium (Mg) and and/or silver (Ag), and/or or an alloy of magnesium (Mg) and/or aluminum (Al). When the first electrode 111 and the second electrode 115 are applied with respective voltages, a hole from the first electrode 111 and an electron from the second electrode 113 may be transported to the organic light emitting layer 113, thereby forming an exciton. When a transition of the exciton from an excited state to a ground state occurs, a white light may be produced and emitted.

The white light may pass through the respective first electrodes 111 of the red, green and blue sub-pixels R-SP, G-SP and B-SP, and then may be converted into red, green and blue lights while passing through the color conversion layers 106 of the red, green and blue sub-pixels R-SP, G-SP, and B-SP. Accordingly, the flexible OLED device 100 may display images in full color with a high brightness. The protection film 102 in the form of a thin film may be formed over the driving thin film transistor DTr and the light emitting diode E so that the flexible OLED device 100 may be encapsulated by the protection film 102.

To prevent external oxygen and moisture from permeating into the flexible OLED device 100, the protection film 102 may include first to third protective films 102a, 102b and 102c. Each of the first and third protective film 102a and 102c may be formed of an inorganic insulating layer, and the second protective film 102b may be formed of an organic insulating layer to supplement an impact resistance of the first and third protective films 102a and 102c. In some example embodiments, a structure of the first to third protective films 102a to 102c in which the organic insulating layer and the inorganic insulating layer may be alternately and repeatedly stacked. In such example embodiments, to prevent moisture and oxygen from permeating through side surfaces of the second protective film 102b formed of the organic insulating layer, the first and third protective films 102a and 102c may completely cover the second protective film 102b. Accordingly, the flexible OLED device 100 can prevent moisture and oxygen from permeating into the flexible OLED device 100 from the outside.

In the flexible OLED device 100, the second protective film 102b may include a plurality of holes H1 formed therein. Each hole H1 may be formed in a mesh structure along the non-emission region NEA. By the hole H1, the second protective film 102b may be divided by sub-pixel. The hole H1 may be formed by etching (e.g., dry etching) the second protective film 102b using a mask. For example, an ion beam etching, a radio frequency (RF) sputter etching, a plasma etching, or a reactive ion etching may be used. A mask may be positioned over the second protective film 102b to correspond to the bank 119 in the non-emission region NEA, and then the second protective film 102b may be etched until a portion of the first protective film 102a is exposed. Thus, the hole H1 may be formed in the second protective film 102b. Accordingly, without additional material and process to form a structure, using existing layer(s), the hole H1 may be formed in the second protective film 102b.

Forming the hole H1 in the second protective film 102b out of the first to third protective films 102a to 102c may be because a thickness of the second protective film 102b formed of an organic insulating layer may be greater than that of each of the first and third protective films 102a and 102c. In this regard, each of the first and third protective films 102a and 102c may have a thickness of about 1 micrometer, and the second protective film 102b may have a thickness of about 6 micrometers. The second protective film 102b may have the greatest thickness in the flexible OLED device 100. Because the hole H1 may be formed in the second protective film 102b having the greatest thickness and along the non-emission region NEA of each sub-pixel, the flexible OLED device 100 may minimize or reduce a bending stress. This is explained in detail further with reference to FIGS. 4A and 4B.

FIG. 4A is a view illustrating a stress (e.g., a bending stress) applied to a second layer 202 when a first layer 201 and a second layer 202 that may be each continuously formed may be folded to have a certain radius of curvature. In this regard, when the second layer 202, which may be continuously formed, may be located on the first layer 201, which is continuously formed, a tensile stress A may be applied to the second layer 202 and a compressive stress B may be applied to the first layer 201.

A stress is a resistance force produced in a material against a magnitude of a load (e.g., an external force), such as compression, tension, bending, and/or twisting, when the load is applied to the material. A stress increases as an external force increases, but there may be a limit to a stress. Thus, when a stress reaches a material's unique limit, the material may be irresistible to an external force and may be destroyed. When the stresses in different directions are applied, cracks may be produced in the first layer 201 and the second layer 202, and thus a detachment between the first layer 201 and the second layer 202 happens.

As illustrated in FIG. 4B, a plurality of holes H may be formed in the second layer 202. Even though the first and second layers 201 and 202 may be bent at the same radius of curvature, a tensile stress B applied to the second layer 202 may be dispersed by the holes H, and thus a stress applied to the second layer 202 may be relieved. Accordingly, the stresses applied to the first and second layers 201 and 202 may be reduced, and thus cracks produced in the first and second layers 201 and 202 may be minimized or reduced. Therefore, because the holes H1 may be formed in the second protective film 102b having the greatest thickness and along the non-emission regions NEA of the sub-pixels R-SP, G-SP and B-SP, a bending stress may be dispersed by the hole H1 of the second protective film 102b. Accordingly, a bending stress of the flexible OLED device 100 may be minimized or reduced, and thus a detachment of the organic light emitting layer 113 may be prevented.

Further, external moisture and substance permeating into the flexible OLED device 100, which may be caused by cracks produced by a bending stress to the first to third protective films 102a to 102c, may be prevented. Even though a detachment of the organic light emitting layer 113 happens partially, a spread of the detachment may be prevented by the holes H1. Even though cracks may be produced in the first to third protective films 102a to 102c, a spread of external moisture and substance may be prevented. As a result, a reliability of the flexible OLED device 100 may be improved.

Figure 5:
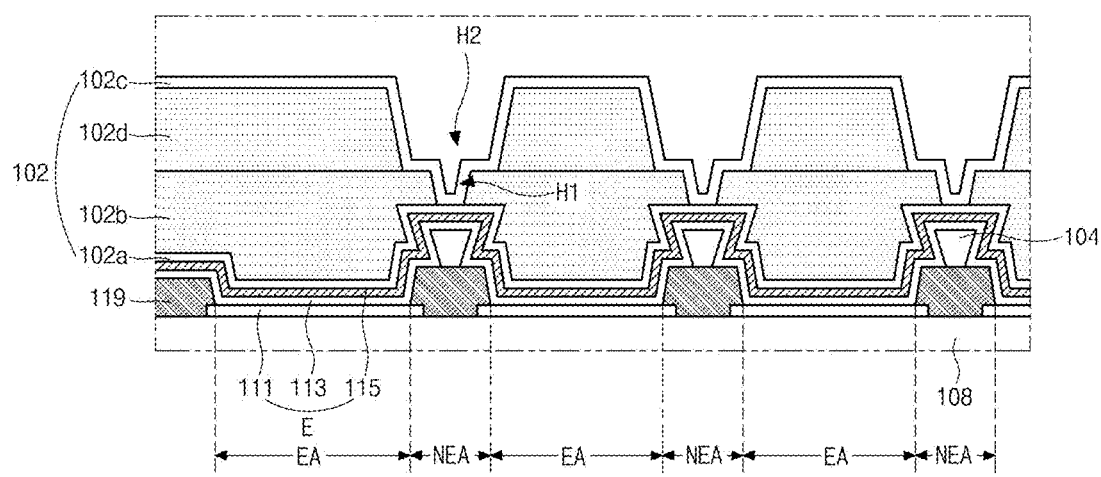
FIG. 5 is a cross-sectional view schematically illustrating another example of an OLED device according to a first example embodiment of the present disclosure.

To effectively prevent external moisture and oxygen from permeating into the flexible OLED device 100, the protection film 102 may have a thickness of about 8 micrometers or greater. In this regard, each of the first and third protective films 102a and 102c made of an inorganic insulating material may have a thickness of about 1 micrometer. When the second protective film 102b is made of an organic material, for example, a negative type polyacrylate, which may be available at a low temperature of about 85 Celsius degrees, the second protective film 102b may be formed in a double-layered structure of first and second sub films 102b and 102d, as illustrated in FIG. 5. In this regard, the flexible OLED device 100 may be manufactured using low temperature processes below 200 Celsius degrees because the substrate 101 may be made of a plastic material to have a bendable property. Thus, the second protective film 102b may be made of an organic material, such as a negative type polyacrylate, which may be available in a low temperature process below 200 Celsius degrees. However, an organic material, such as a negative type polyacrylate may form a layer at an allowable maximum thickness of about 3 micrometers. The flexible OLED device 100 including the protective film 102b made of such organic material may not be certainly enough to prevent external moisture and oxygen from permeating into the flexible OLED device 100.

As illustrated in FIG. 5, the second protective film on the first protective film 102a may be configured with the first sub film 102b and the second sub film 102d separately formed therein, and the third protective film 102c may be formed on the second sub film 102d. Accordingly, the second protective film 102b and 102d may be formed using an organic material, such as a negative type polyacrylate, and thus external moisture and oxygen permeating into the flexible OLED device 100 may be prevented. In FIG. 5, the first sub film 102b and the second sub film 102d including respective holes H1 and H2, which may be formed using different etching processes, are described by way of example. Alternatively, the holes H1 and H2 may be formed using a batch etching process (or a simultaneous etching process) of the first and second sub films 102b and 102d.

Because the holes H1 may be formed in the second protective film 102b of the protection film 102, and along the non-emission regions NEA of the sub-pixels R-SP, G-SP and B-SP, a bending stress produced in repetitive works of folding and spreading the flexible OLED device 100 can be minimized or reduced. Therefore, a detachment of the organic light emitting layer 113 can be prevented.

Further, external moisture and oxygen permeating into the flexible OLED device 100 can be prevented. Even though a detachment of the organic light emitting layer 113 happens partially, a spread of the detachment can be prevented by the holes H1. Even though cracks may be produced in the first to third protective films 102a to 102c, a spread of external moisture and substance can be prevented. As a result, a reliability of the flexible OLED device 100 can be improved.

Figure 6:
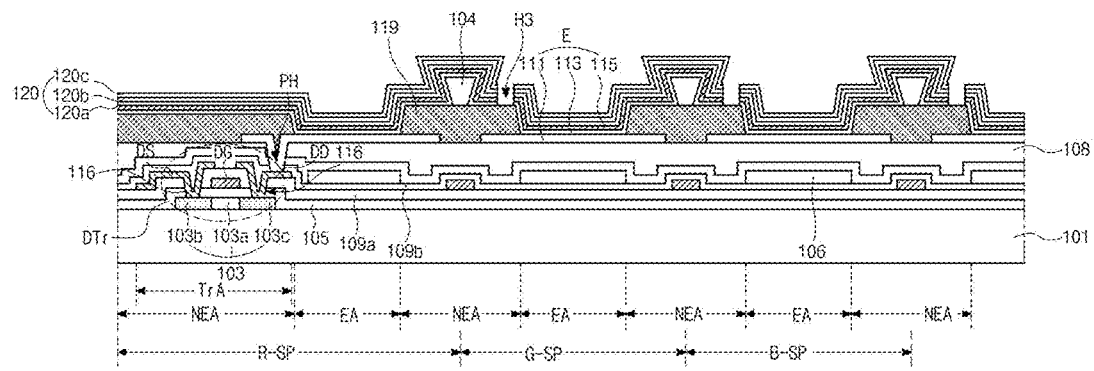
FIG. 6 is a cross-sectional view schematically illustrating a part of each sub-pixel of a flexible OLED device according to a second example embodiment of the present disclosure.

FIG. 6 is a cross-sectional view schematically illustrating a part of each sub-pixel of a flexible OLED device according to a second example embodiment of the present disclosure. As illustrated in FIG. 6, a driving TFT DTr including a semiconductor layer 103, a gate insulating layer 105, a gate electrode DG, and source and drain electrodes DS and DD, may be located at a switching region TrA of a non-emission region NEA of each sub-pixel on a substrate 101. A first electrode 111 may be formed on the overcoat layer 108 and may be connected to the drain electrode DD of the driving TFT DT through a drain contact hole PH in the second and third inter-layered insulating layers 109b and 109c and the overcoat layer 108.

The first electrode 111 may be made of a metal oxide material such as ITO and/or IZO, a mixture of a metal and an oxide material such as ZnO:Al and SnO$_2$:Sb, and/or a conductive polymer such as Poly(3-methylthiophene), Poly[3,4-(ethylene-1,2)-thiophene] (PEDT), polypyrrole and polyaniline. Alternatively, the first electrode 111 may be formed of a carbon nano tube (CNT), graphene, and/or a silver nano wire. The first electrodes 111 may be located individually at respective sub-pixels R-SP, G-SP and B-PS, and a bank 119 may be located between the first electrodes 111 of the sub-pixels R-SP, G-SP and B-PS. For example, the first electrodes 111 may be separate from each other with the bank 119 as a boundary portion of each pixel region SP.

An inverted spacer 104 may be located on the bank 119. The inverted spacer 104 may serve to buffer an empty space between the substrate 101 and a protection film 120 and thus minimize or reduce the amount of the flexible OLED device 100 being damaged by an external impact. The inverted spacer 104 may function to relieve a bending stress to one or more layers including the organic light emitting layer 113 in a work of folding the flexible OLED device 100. The organic light emitting layer 113 and the second electrode 115 may be sequentially located on the first electrode 111, the bank 119 and the inverted spacer 104. The organic light emitting layer 113 may be formed with a single layer made of an emitting material. Alternatively, to increase an emission efficiency, the organic light emitting layer 113 may be formed with multiple layers that may include a hole injection layer, a hole transport layer, an emitting material layer, an electron transport layer and an electron injection layer.

The second electrode 115 may be made of a metal material having a relatively low work function to serve as a cathode. For example, the second electrode 115 may be made of an alloy of magnesium (Mg) and/or silver (Ag), and/or an alloy of magnesium (Mg) and/or aluminum (Al). The first electrode 111, the organic light emitting layer 113 and the second electrode 115 may form the light emitting diode E. A protection film 120 in the form of a thin film may be formed over the driving thin film transistor DTr and the light emitting diode E so that the flexible OLED device 100 may be encapsulated by the protection film 120.

To prevent external oxygen and moisture from permeating into the flexible OLED device 100, the protection film 120 may include first to third protective films 102a, 102b, and 102c. Each of the first and third protective films 120a and 120c may be formed using an atomic layer deposition (ALD) method. For example, each of the first and third protective films 120a and 120c may be made of ZnS, ZnSe, ZnTe, CdS, CdTe, ZnS:Mn, CaS:Ce, SrS:M, GaAs, AlAs, GaP, AlN, GaN, TiN, TaN, CaF$_2$, SrF$_2$, Si, Mo, and/or W. Alternatively, each of the first and third protective films 120a and 120c may be made of an oxide, such as AlOx, AlOxNy, TiOx, SiOx, ZnOx, and/or ZrOx. Because each of the first and third protective films 120a and 120c may be formed by stacking atom layers, each of the first and third protective films 120a and 120c may be formed in a very thin film. Each of the first and third protective films 120a and 120c may have a thickness of, for example, about 0.01 micrometer to about 0.1 micrometer, and a thickness and a composition thereof may be adjusted minutely.

A uniform film may be formed over a large-sized substrate, and a step coverage capability may be excellent. Accordingly, with the first protective film 120a covering the driving TFT DTr and the light emitting diode E, a reliability of the flexible OLED device 100 may be further improved. Further, the second protective film 120b may be formed of an inorganic insulating material, for example, SiNx or SiOx. This may result in the second protective film 120b between the first and third protective films 120a and 120c preventing external moisture and oxygen from permeating into the flexible OLED device 100 along with the first and third protective films 120a and 120. This may also further increase a stiffness of the first and third protective films 120a and 120c. Alternatively, the protection film 120 may be formed in a five-layered structure including at least three inorganic layers that may be each formed using an ALD method.

The protection film 120 of this example embodiment may be formed at a thickness that may be much less than that of the protection film 102 of the first example embodiment. Accordingly, the flexible OLED device 100 of this example embodiment may have a further flexible property. In the flexible OLED device 100 of this example embodiment, a hole H3 may be located at a side of the inverted spacer 104 and be formed in the organic light emitting layer 113, the second electrode 115, and the protection film 120.

Through the hole H3, the bank 119 located below the organic light emitting layer 113 may be exposed. The hole H3 may be formed along the non-emission region of each sub-pixel. The hole H3 may have a mesh structure. The hole H3 may be located at each of left and right sides of each sub-pixel or at one of left and right sides of each sub-pixel such that the second electrode 115 has a continuously connected structure over the sub-pixels R-SP, G-SP and B-SP. Even though cracks may be produced in the protection film 120 by a bending stress caused due to repetitive works of folding and spreading the flexible OLED device 100 and a detachment of the organic light emitting layer 113 partially happens, the detachment can be prevented by the hole H3. Further, even though cracks may be produced in the protection film 120, and a spread of external moisture and substance can be prevented. As a result, a reliability of the flexible OLED device 100 can be improved.

Figure 7:
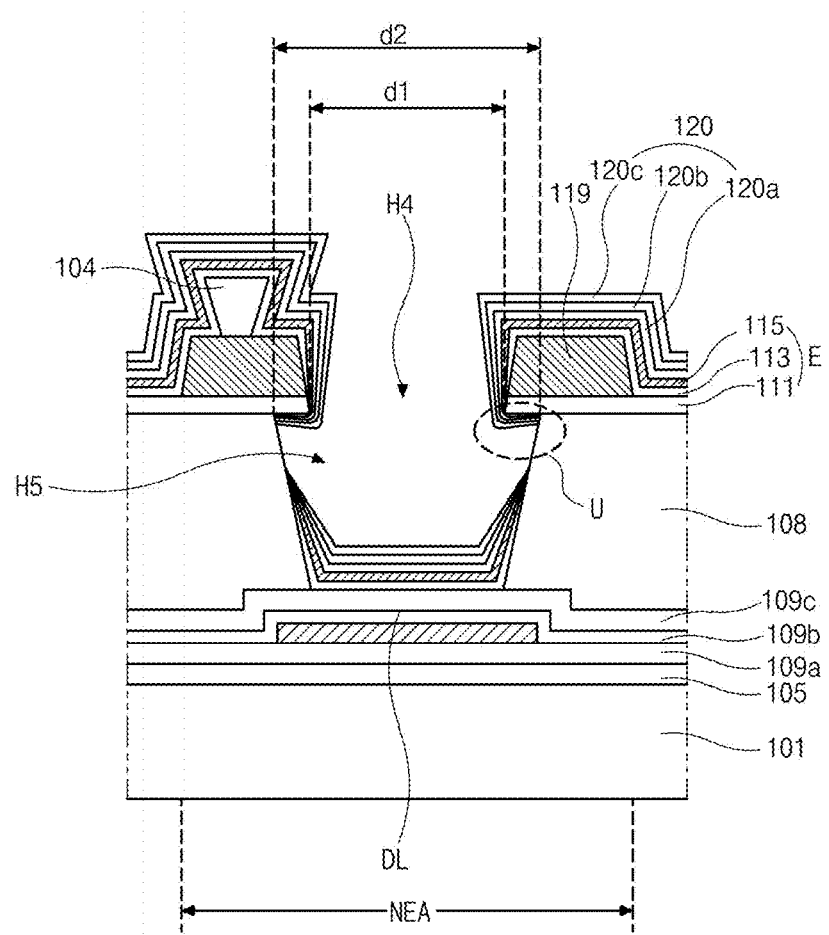
FIG. 7 is a cross-sectional view schematically enlarging a part of a sub-pixel of a flexible OLED device according to a third example embodiment of the present disclosure.

FIG. 7 is a cross-sectional view schematically enlarging a part of a sub-pixel of a flexible OLED device according to a third example embodiment of the present disclosure. A first hole H4 may be formed in a bank 119 and a first electrode 111 corresponding to a non-emission region NEA of each of red, green and blue sub-pixels (e.g., R-SP, G-SP, and B-SP of FIG. 6), and a second hole H5 may be formed in an overcoat layer 108 corresponding to the first hole H4. The second hole H5 may expose a third inter-layered insulating layer 109c. The second hole H5 may have a width d2 greater than a width d1 of the first hole H4 so that the first electrode 111 and the overcoat layer 108 may form an undercut U. In this regard, the bottom width d1 of the first hole H4 in the first electrode 111 may be less than the top width d2 of the second hole H5 in the overcoat layer 108. For example, because the top width d2 of the second hole H5 may be greater than the bottom width d1 of the first hole H1 close to the organic light emitting layer 113, the first electrode 111 may protrude laterally over the second hole H2.

The first hole H1 and the second H2 may be formed by a batch etching process for the bank 119 and the overcoat layer 108 using a mask. The bank 119 and the overcoat layer 108 may be dry etched at different etch rates. For example, an ion beam etching, an RF sputter etching, a plasma etching, or an reactive ion etching may be used. The organic light emitting layer 113 and the second electrode 115 may be sequentially located on the substrate 101 having the first and second holes H4 and H5. The first to third protective films 120a to 120c may be sequentially located on the second electrode 115. Each of the organic light emitting layer 113, the second electrode 115, and the first to third protective films 120a to 120c may have a separated structure by the first and second holes H4 and H5.

Even though cracks may be produced in the protection film 120 by a bending stress caused due to repetitive works of folding and spreading the flexible OLED device 100 and thus a detachment of the organic light emitting layer 113 partially happens, the detachment may be prevented by the first and second holes H4 and H5. Further, even though cracks may be produced in the protection film 120, a spread of external moisture and substance may be prevented. As a result, a reliability of the flexible OLED device 100 may be improved. Particularly, because the second hole H5 may be formed in the overcoat layer 108, the overcoat layer 108 may be separated by sub-pixel. Thus, a bending stress may be minimized or reduces, and cracks produced in the overcoat layer 108 may be prevented from being propagated to the organic light emitting layer 113 or the driving TFT (e.g., DTr of FIG. 6).

In more detail, cracks may be frequently produced in the overcoat layer 108 by a bending stress caused due to repetitive folding and spreading the flexible OLED device 100. This may be because the overcoat layer 108 has the greatest thickness in the flexible OLED device 100 including the protection film 120 formed using an ALD method. Accordingly, the second hole H5 may be formed in the overcoat layer 108, thus a bending stress may be dispersed by the second hole H5 and minimized or reduced. As the bending stress is minimized or reduced, a detachment of the organic light emitting layer 113, a disconnection of the driving TFT DTr, which may be caused due to a propagation of cracks of the overcoat layer 108 to the organic light emitting layer 113 or the driving TFT located near the overcoat layer 108, may be prevented. In the flexible OLED device 100, the first electrode 111 and the overcoat layer 108 may form the undercut U, and thus the organic light emitting layer 113 and the second electrode 115, which may be deposited straightly in a vertical direction, may not be formed at a region of the undercut U. Thus, each of the organic light emitting layer 113 and the second electrode 115 may be separated at each of left and right sides of each sub-pixel or one of left and right sides of each sub-pixel.

The protection film 120 deposited with diffractions in vertical direction, horizontal direction and slope direction may have a better step coverage than the second electrode 115 and the organic light emitting layer 113 and thus may be formed at the region of the undercut U. The first to third protective films 120a to 120c may have a tip shape to completely cover and enclose the first electrode 111 forming the undercut U. Accordingly, an exposure of the first and second electrodes 111 and 115 may be prevented by the tip shape. This is true even though the first and second holes H4 and H5 may be respectively formed in the bank 119 and the overcoat layer 108 to prevent a detachment of the organic light emitting layer 113 and a spread of external moisture and substance. Accordingly, an oxidation of the first and second electrodes 111 and 115 caused by an exposure of the first and second electrodes 111 and 115 may be prevented.

Because the holes H4 and H5 may be formed in the bank 119, the first electrode 113 and the overcoat layer 108, even though a detachment of the organic light emitting layer 113 happens by a bending stress, a spread of the detachment can be prevented. Further, even though cracks may be produced in the protection film 120, a spread of external moisture and substance can be prevented. As a result, a reliability of the flexible OLED device 100 can be improved. Further, because the second hole H5 may be formed in the overcoat layer 108 that has the greatest thickness in the flexible OLED device 100, a bending stress can be dispersed by the second hole H5 and be minimized or reduced. Thus, a detachment of the organic light emitting layer 113 and/or a disconnection of the driving TFT, which may be caused due to a propagation of cracks of the overcoat layer 108 to the organic light emitting layer 113 or the driving TFT DTr located near the overcoat layer 108, can be prevented.

Particularly, because the first and second holes H4 and H5 may form the undercut U and the tip shape may be formed, a detachment of the organic light emitting layer 113 and a spread of external moisture and substance can be prevented, and an exposure of the first and second electrodes 111 and 115 can be prevented. In the above example embodiments, one inverted spacer 104 formed on the bank 119 is described by way of example. However, a plurality of spacers 104 may be formed on the bank 119. The hole H3 of the second example embodiment may be located between neighboring inverted spacers 104, and the first and second holes H4 and H5 of the third example embodiment may be located between neighboring inverted spacers 104. Further, no inverted spacer 104 may be formed in the flexible OLED device 100. The hole H1 of the first example embodiment may be formed on the bank 119. Further, a spacer having a taper shape (e.g., a non-inverted taper shape) may be located at a side of the inverted spacer 104. The taper shaped spacer may have a height greater than that of the inverted spacer 104, and thus an empty space between the substrate 101 and the protection film 102 or 120 may be further buffered.

In an OLED device of any one of fourth to eighth example embodiments, a permeation of foreign substances, such as moisture and air into a lower electrode and an organic light emitting layer may be minimized or reduced. Particularly, to minimize or reduce cracks caused by a continuous and repetitive stress at a bending region of a flexible OLED device, an opening where an encapsulation layer and a bank are not formed may be formed at a bending region. Further, in an OLED device of any one of the fourth to eighth example embodiments, a permeation of foreign substances, such as moisture and air into a flexible OLED device may be effectively minimized or reduced. In a general OLED device (e.g., a non-flexible display device), a lower substrate, where an electrode and an organic light emitting layer may be formed, and an upper substrate may be formed of a rigid material, such as glass. Thus, foreign substances such as moisture and air may not permeate through an upper portion of an OLED device.

However, in a flexible OLED device, a lower substrate may use a plastic substrate of a flexibility, and an upper substrate may use a protection film made of a flexible material. Thus, a permeation of foreign substances such as moisture and air may be caused. Accordingly, in a flexible OLED device of any one of the fourth to eighth example embodiments, a plurality of inorganic insulating layers and organic insulating layers may be stacked to form a structure that may block a permeation of foreign substances. Particularly, to minimize or reduce a permeation of foreign substances, such as moisture and air, through an opening where an encapsulation layer may not be formed, an encapsulation layer may be formed at a side of a light emitting element to completely encapsulate the light emitting element.

Figure 8:
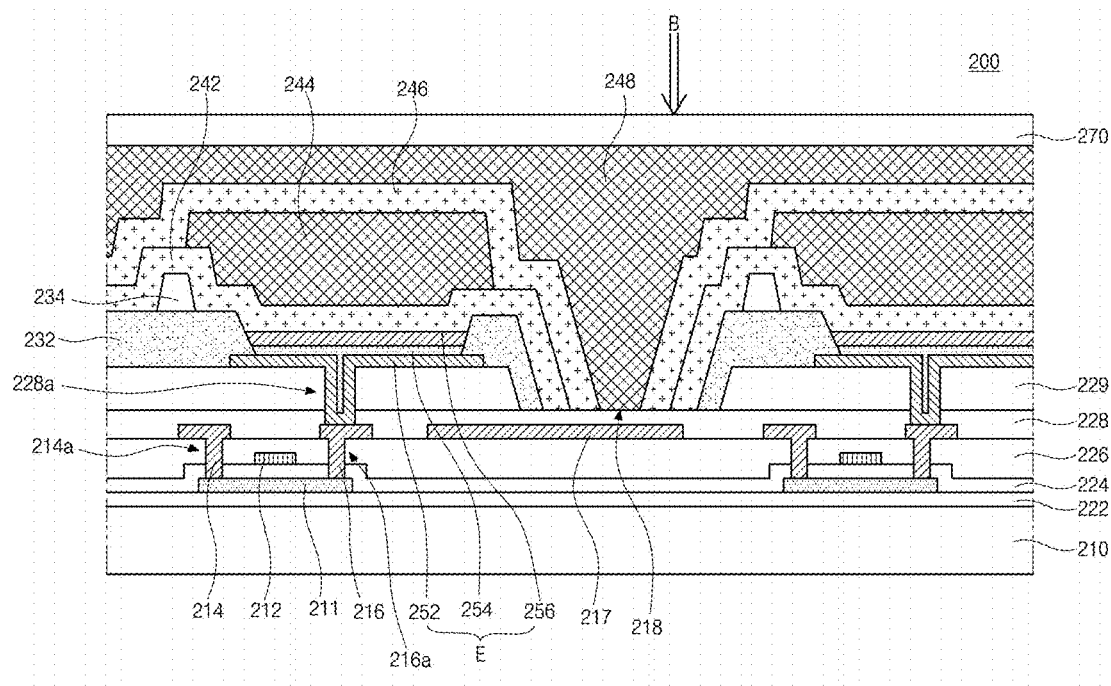
FIG. 8 is a cross-sectional view illustrating a structure of an OLED device according to a fourth example embodiment of the present disclosure.

FIG. 8 is a cross-sectional view illustrating a structure of an OLED device according to a fourth example embodiment of the present disclosure. A plurality of sub-pixels may be arranged in an n*m matrix form in a flexible OLED device (where each of n and m may be an integer greater than or equal to 1). Two neighboring sub-pixels are illustrated in FIG. 8. As illustrated in FIG. 8, a bending region B may be formed (or defined) in the flexible OLED device 200. A specific region may be not bent in the flexible OLED device 200, and the flexible OLED device 200 may be installed and used in a curved state (or bent state), or may be repeatedly curved and spread.

Accordingly, a stress may be continuously and repeatedly applied over an entire of the flexible OLED device 200, and thus the bending region B may be produced over an entire region of the flexible OLED device 200. However, an actual bending may be produced at a region where components may be formed of flexible materials. For example, a user may use the flexible OLED device in a flat state, then in a curved state at a certain radius of curvature. This may produce bending along a curved direction over an entire region of the flexible OLED device 200, but an actual bending region may be a region that may be formed of flexible materials. In this example embodiment, a bank layer, a first inorganic encapsulation layer, an organic encapsulation layer, a second inorganic encapsulation layer, and a planarization layer may be removed at the bending region. Therefore, cracks at the layers by application of continuous and repetitive stress may be minimized or reduced and a destruction of the device due to a propagation of the cracks may be minimized or reduced.

In the flexible OLED device 200, the bending region B may be formed between a sub-pixel and its neighboring sub-pixel. In this regard, because a metal layer may be formed in a light emitting element (or light emitting diode) in the sub-pixel and has little flexibility, the bending region B may be formed between the neighboring sub-pixels when the flexible OLED device 200 is curved. A buffer layer 222 may be formed on a first substrate 210. A driving TFT may be located on the buffer layer 222. The first substrate 210 may be made of a transparent and flexible plastic, such as polyimide. The buffer layer 222 may be formed with a single-layered structure including an inorganic layer, or with a multiple-layered structure including an inorganic layer and an organic layer. The inorganic layer may be made of an inorganic insulating material, such as SiOx or SiNx, and the organic layer may be made of an organic insulating material, such as poly acryl.

Because the buffer layer 222 may be formed with a single-layered structure including an inorganic layer, or with a multiple-layered structure including an inorganic layer, moisture and air passing through a plastic weak to moisture and air may be minimized or reduced, and thus a degradation of an organic light emitting layer may be minimized or reduced. The driving TFT may be formed in each sub-pixel. The driving TFT may include a semiconductor layer 211 on the buffer layer 222, a gate insulating layer 224 on the semiconductor layer 222, a gate electrode 212 on the gate insulating layer 224, an inter-layered insulating layer 226 on the gate electrode 212, and source and drain electrodes 214 and 216 on the inter-layered insulating layer 226. Source and drain electrodes 214 and 216 may contact the semiconductor layer 211 through respective contact holes 214a and 216a in the inter-layered insulating layer 226. The gate insulating layer 224 may be formed entirely over the first substrate 210, and the inter-layered insulating layer 226 may be formed entirely over the first substrate 210.

The semiconductor layer 211 may be made of polycrystalline silicon or oxide semiconductor material, such as IGZO. The semiconductor layer 211 may include a channel portion at a center region thereof, and doping portions at both sides of the channel portion. The source and drain electrodes 214 and 216 may contact the respective doping portions. Alternatively, the semiconductor layer 211 may be made of amorphous silicon and/or organic semiconductor material. The gate electrode 212 may be formed with a single-layered or multiple-layered structure using a metal, for example, Cr, Mo, Ta, Cu, Ti, Al, and/or Al alloy. The gate insulating layer 224 may be formed with a single-layered structure using an inorganic material, for example, SiOx and/or SiNx, or with a double-layered structure using a layer of SiOx and/or a layer of SiNx. The inter-layered insulating layer 226 may be formed with a single-layered or multiple-layered structure using an inorganic material, such as SiOx or SiNx. The source and drain electrodes 214 and 216 may be made of using a metal, such as Cr, Mo, Ta, Cu, Ti, Al, and/or Al alloy.

The driving TFT of a specific structure is described by way of example. However, the driving TFT may have other structure. A passivation layer 228 may be formed on the substrate 210 having the driving TFT, and a planarization layer 229 may be formed on the passivation layer 228. The passivation layer 228 may be formed with a single-layered structure using an inorganic material, or with a multiple-layered structure using an inorganic material and an organic material. The planarization layer 229 may be made of an organic material, for example, photo acryl. An organic light emitting diode E may be formed on the planarization layer 228, and be connected to the drain electrode 216 of the driving TFT through a contact hole 228a formed in the passivation layer 228 and the planarization layer 229. The organic light emitting diode E may include a first electrode 252 connected to the drain electrode 216 through the contact hole 228a, an organic light emitting layer 254 on the first electrode 252, and a second electrode 256 on the organic light emitting layer 254.

The first electrode 111 may be formed with a single-layered or multiple-layered structure using a metal, such as Ca, Ba, Mg, Al, Ag, and/or alloy(s) thereof. The first electrode 111 may be connected to the drain electrode 216 of the driving TFT and may receive an image signal. The first electrode 252 may serve as a reflector to reflect a light emitted from the organic light emitting layer 254 toward an upper direction (e.g., a direction opposite to the first substrate 110). Further, the first electrode 111 may be formed of a transparent metal oxide, such as ITO and/or IZO. The second electrode 256 may be formed of a transparent metal oxide, such as ITO and/or IZO. Alternatively, the second electrode 256 may be formed with a single-layered or multiple-layered structure using a metal, such as Ca, Ba, Mg, Al, Ag, and/or alloy(s) thereof. The second electrode 256 may serve as a reflector to reflect a light emitted from the organic light emitting layer 254 toward a lower direction (e.g., a direction to the first substrate 110).

When the OLED device 200 is a bottom emission type device to output an emitted light toward a lower direction, the first electrode 252 may be formed of a transparent metal oxide and the second electrode 256 may be formed of a metal or metal compound reflecting a light. When the OLED device 200 is a top emission type device to output an emitted light toward an upper direction, the first electrode 252 may be formed of a metal and/or metal compound as a reflector, and the second electrode 256 may be formed of a transparent metal oxide.

The organic light emitting layer 254 may be formed separately in each of red, green, and blue sub-pixels. The organic light emitting layer 254 in the red sub-pixel may be a red organic light emitting layer emitting a red light. The organic light emitting layer 254 formed in the green sub-pixel may be a green organic light emitting layer emitting a green light. The organic light emitting layer 254 formed in the blue sub-pixel may be a blue organic light emitting layer emitting a blue light. Alternatively, the organic light emitting layer 254 may be formed entirely over the OLED device 200 and be a white organic light emitting layer emitting a white light. In the white organic light emitting layer, red, green, and blue color filters may be formed on the white organic light emitting layer in the red, green, and blue sub-pixels to convert white lights into red, green, and blue lights. The white organic light emitting layer may be formed of a mixture of organic materials respectively emitting red, green, and blue lights, and/or be formed with red, green, and blue organic light emitting layers stacked. Alternatively, the organic light emitting layer 254 may be replaced with an inorganic light emitting layer made of inorganic light emitting material, for example, quantum dots.

The organic light emitting layer 254 may include an emitting material layer, a hole injection layer, a hole transport layer, an electron transport layer, and an electron injection layer. A bank 232 may be formed on the planarization layer 229 at a boundary region of the sub-pixel. The bank 232 may serve as a partition wall to separates the sub-pixels from each other, and thus different color lights output from adjacent sub-pixels being mixed and then output may be minimized or reduced. A part of the bank 232 located on the first electrode 252 is described in FIG. 8 by way of example. Alternatively, the bank 232 may be formed on the planarization layer 229 and the first electrode 152 may be formed on a side surface of the bank 132. If the first electrode 252 is extended on the side surface of the bank 232, the first electrode 252 may be formed at an edge region of a boundary between the bank 232 and the planarization layer 229. Therefore, a signal may be applied to the organic light emitting layer 254 even at the edge region and emission may be produced even at the edge region, and thus an image may be produced even at the edge region. Accordingly, a non-display region where an image is not displayed in the sub-pixel may be minimized or reduced.

A first encapsulation layer 242 may be formed on the organic light emitting diode E and the bank 232. The first encapsulation layer 242 may be formed of an inorganic material, for example, SiNx and/or SiX. The second encapsulation layer 244 may be formed on the first encapsulation layer 242 over the organic light emitting diode E. The second encapsulation layer 244 may be made of an organic material. For example, the second encapsulation layer 244 may be made of polyethylene terephthalate, polyethylene naphthalate, polycarbonate, polyimide, polyethylene sulfonate, polyoxymethylene, and/or polyacrylate. The second encapsulation layer 244 may be in an island shape on the first second encapsulation layer 242. The second encapsulation layer 244 may fully cover (or fully shield) the organic light emitting diode E therebelow.

As such, the second encapsulation layer 244 may be formed separately in its corresponding sub-pixel to have an island shape, and may not be formed in adjacent sub-pixels. Thus, when the OLED device 200 is curved, a stress applied to each of the second encapsulation layers 244, which may be respectively formed in a series of sub-pixels arranged along a bent region, may be confined to the second encapsulation layer 244 of its corresponding sub-pixel and may not be transferred to the second encapsulation layer 244 of adjacent sub-pixels. Accordingly, a stress applied to a bending region may be dispersed, and cracks being produced at the second encapsulation layer 244 by a curving may be minimized or reduced.

A third encapsulation layer 246 may be formed on the first encapsulation layer 242 and the second encapsulation layer 244. The third encapsulation layer 246 may be formed of an inorganic material, such as SiNx and/or SiX. The third encapsulation layer 246 may completely cover a top surface and side surfaces of the second encapsulation layer 244, and thus the second encapsulation layer 244 may be completely encapsulated (or enclosed) by the first encapsulation layer 242, and the third encapsulation layer 246.

A transparent filling member 248 may be coated on the third encapsulation layer 246, and a second substrate 270 may be located on the filling member 248. The first substrate 210 and the second substrate 270 may be coupled to each other by the filling member 248. The filling member 248 may be made of any material having a high adhesion property, thermal resistance, and/or water resistance. For example, the filling member 248 may be made of an epoxy based compound, an acrylate based compound, and/or a thermosetting resin, such as acryl based rubber. The filling member 248 may be made of a photosensitive resin or thermosetting resin, and a light or heat may be applied to an adhesive layer to harden the filling member 248. The filling member 248 may serve to couple the first and second substrates 210 and 270 and/or serve as an encapsulation layer to minimize or reduce a permeation of moisture into the OLED device 200. Accordingly, the filling member 248 may be referred to as an adhesive member or fourth encapsulation layer.

The second substrate 270 may serve as an encapsulation cap to encapsulate the OLED device 200. The second substrate 270 may be formed using a protection film, for example, a PS (polystyrene) film, a PE (polyethylene) film, a PEN (polyethylene naphthalate film, or a PI (polyimide) film. A separation wall 234 having a predetermined width may be formed on the bank 234 between neighboring sub-pixels. A metal layer 217 may be formed on the interlayered insulating layer 126 and between neighboring organic light emitting diodes E. The separation wall 234 may serve to block moisture and air permeating through an interface the bank 232 and the first encapsulation layer 242. The separation wall 234 may be formed with a single-layered structure using an organic material or inorganic material, or with a multiple-layered structure using an inorganic layer and an organic layer.

The metal layer 217 may be formed at the same process of forming the source and drain electrodes 214 and 216 of the driving TFT. The metal layer 217 may serve to block propagation of moisture and air permeating through between neighboring sub-pixels (e.g., through the bending region B) toward a TFT. The bending region B may be produced between two neighboring sub-pixels, and more specifically, between two neighboring organic light emitting diodes E. Because metals forming the first and second electrodes 252 and 256 have low flexibility, when the flexible OLED device 200 is curved, a bending region may not be a region where the organic light emitting diode E is located but may be a region between the neighboring organic light emitting diodes E. Accordingly, the bending region B of the flexible OLED device 200 may be produced between the neighboring organic light emitting diodes E of the flexible OLED device 200.

In the OLED device 200, a part of the planarization 229 at the bending region B may be removed to form an opening 218. This may be for minimizing or reducing a destruction of the planarization layer 229 at the bending region B by a stress that may be applied due to continuous and repetitive curving. Further, the bank 232, the first encapsulation layer 242 and the third encapsulation layer 246 may extend inside a region, where the planarization layer 229 of the bending region B is removed, e.g., inside the opening 218. Particularly, the bank 232, the first encapsulation layer 242 and the third encapsulation layer 246 may be formed along a side surface (or an inner side surface) of the planarization layer 229 forming the opening 218.

The bank 232, the first encapsulation layer 242 and the third encapsulation layer 246 in each sub-pixel may be formed along side surfaces of two openings 118 that are formed at two boundaries between each sub-pixel and adjacent right and left sub-pixels. Thus, the organic light emitting diode E of each sub-pixel may be completely encapsulated from the openings 218 of the bending regions B produced at both sides of each sub-pixel. When the bank 232, the first encapsulation layer 242, and the third encapsulation layer 246 extend inside the opening 218, the bank 232, the first encapsulation layer 242 and the third encapsulation layer 246 may be formed at a region of a part of the passivation layer 228 below the opening 218. Thus, the bank 232, the first encapsulation layer 242 and the third encapsulation layer 246 of each sub-pixel extending inside the opening 218 may be formed on a part of a top surface of the passivation layer 228. In addition, the bank 232, the first encapsulation layer 242, and the third encapsulation layer 246 of at least one sub-pixel extending inside the opening 218 may be formed on a part of a top surface of the passivation layer 228, and may be formed below the opening 218. Another part of the top surface of the passivation layer 228 may be exposed through the opening 218. For example, a center region of the opening 218 may be a region where the bank 232, the first encapsulation layer 242, and the third encapsulation layer 246 are not formed. The filling member 248 may fill the region of the opening 218 where the bank 232, the first encapsulation layer 242, and the third encapsulation layer 246 are not formed.

The flexible OLED device 200 may be used in a curved state, or used in a flat state and then in a curved state. Accordingly, due to a long time curved state or a repetitive curving, continuous and repetitive stress may be applied to the flexible OLED 100 and particularly to the bending region B. Through the continuous and repetitive stress, internal components of the flexible OLED device 200 may be destroyed. Particularly, the continuous and repetitive stress may be focused on various layers formed of inorganic material and organic material to produce cracks.

When the cracks are produced in the various layers, the cracks may be propagated inside the flexible OLED device 200. This propagation may result in a destruction of the flexible OLED device 200, which may become a defective product. In this example embodiment, because the planarization layer 229, the bank 232, the first encapsulation layer 242, and the third encapsulation layer 246 may not be formed at the bending region B, and the filling member 248 fills the opening 218 exposing the passivation layer 228, a structure where cracks are produced does not exist. Accordingly, even when a continuous and repetitive stress is applied, no cracks may be produced in the flexible OLED device 200, and thus a destruction of the flexible OLED device caused by propagation of the cracks may be minimized or reduced. Further, in this example embodiment, the side surface of the opening 218 may be completely encapsulated by the first encapsulation layer 242 and the third encapsulation layer 246, and thus the organic light emitting diode E located in each sub-pixel may be completely sealed from the outside. Accordingly, external moisture and air may not permeate into the organic light emitting diode E, and particularly, moisture and air may not permeate into the organic light emitting diode E through the bending region B.

Without employing an additional component to minimize or reduce a destruction of a structure or an additional component to block impurities such as moisture and air, a part of the planarization layer 229 at the bending region B may be removed. This forms the opening 218, the bank 232, and the first encapsulation layer 242. The third encapsulation layer 246 may extend inside the opening 218. Accordingly, without adding new structure, a structure of existing layers may be formed in different form, and thus a destruction by a propagation of cracks may be minimized or reduced and a permeation of moisture and air may be blocked. Therefore, a permeation of moisture and air may be prevented without additional process and cost.

Figure 9A:
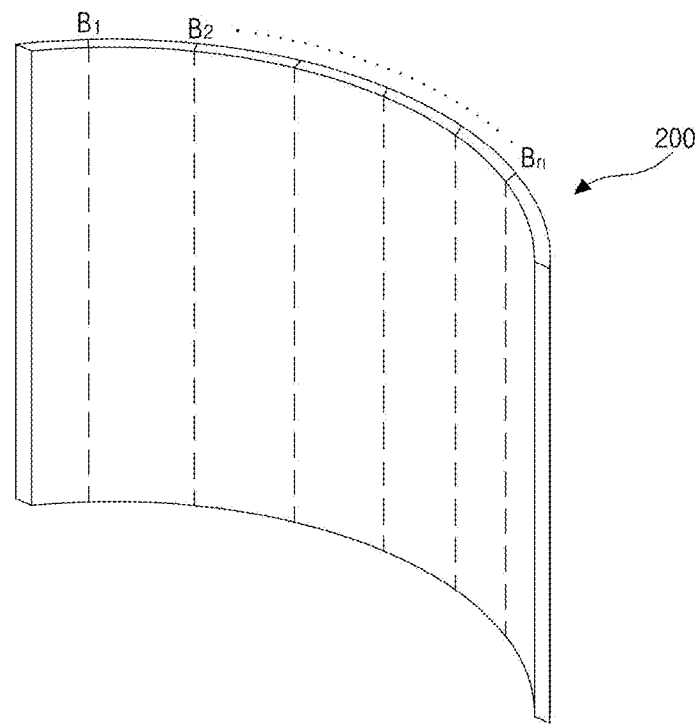
FIGS. 9A to 9C illustrate a flexible OLED device with a structure according to a fourth example embodiment of the present disclosure.
Figure 9B:
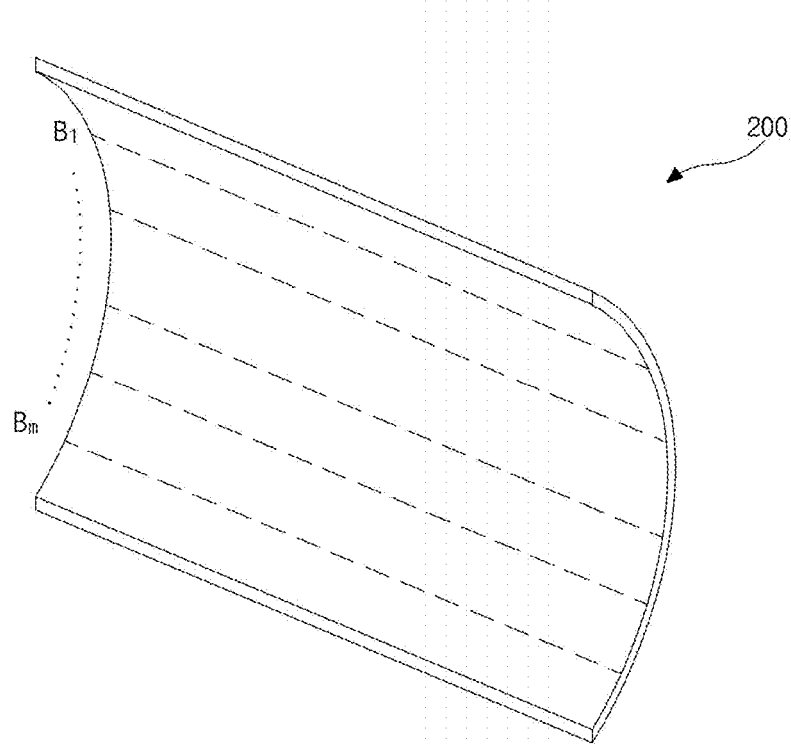
Figure 9C:
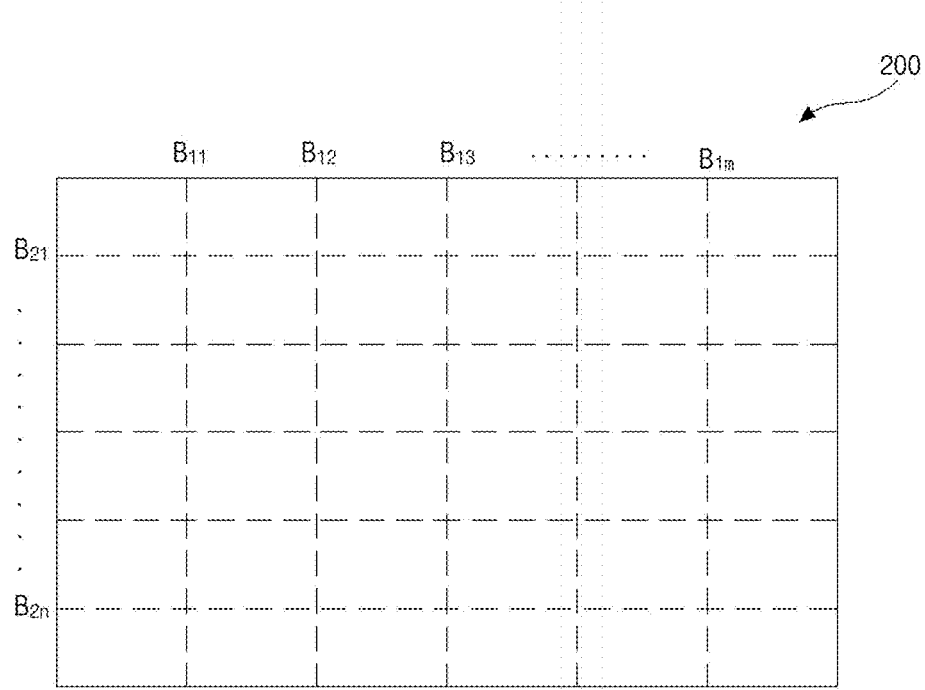

FIGS. 9A to 9C illustrate a flexible OLED device with a structure according to a fourth example embodiment of the present disclosure. As illustrated in FIG. 9A, the flexible OLED device 200 may be curved in a long side (or long dimension) direction, for example, in a horizontal direction. Because the flexible OLED device may be curved not at a specific region but at an entire region along the long side direction, bending regions B1, B2, . . . , and Bn may be produced over the entire region of the flexible OLED device 200 along the long side direction e.g., along a flexible direction. Further, the flexible OLED device 200 may be curved at various curvatures along the long side direction, and the different bending regions may be curved at different curvatures. A plurality of openings 218 of the planarization layer 229 may be formed in a short side (or short dimension) direction, for example, in a vertical direction along each bending region. Each of a plurality of sub-pixels arranged along the short side direction may be sealed from other regions by the first encapsulation layer 242 and the third encapsulation layer 246 that may be formed at inner side walls of the openings 218.

As illustrated in FIG. 9B, the flexible OLED device 200 may be curved in the short side direction, for example, in the horizontal direction. In this structure, a plurality of openings 218 of the planarization layer 229 may be formed in the long side direction along each of a plurality of bending regions B1, B2, . . . , and Bm. Each of a plurality of sub-pixels arranged along the long side direction may be sealed from other regions by the first encapsulation layer 242 and the third encapsulation layer 246 that may be formed at inner side walls of the openings 218. As illustrated in FIG. 9C, the flexible OLED device 200 may be curved in both of the short side direction and in the long side direction, for example, in both of the horizontal direction and the vertical direction. In this structure, a plurality of openings 218 of the planarization layer 229 may be formed in each of the long side direction and the short side direction along each of a plurality of bending regions B11, B12, . . . , B1m, B21, B22, . . . , and B2n. A sub-pixel located at a region may be sealed from other regions by the first encapsulation layer 242 and the third encapsulation layer 246 that may be formed at inner side walls of the openings 218.

Bending regions B may be set and openings 218 may be formed at the bending regions B. Thus, all structures, which may be destroyed by a bending, may be removed, and all regions exposed through the openings 218 of the bending regions B may be sealed. Accordingly, a permeation of moisture and air through a portion where the structure of the bending region B may be removed, minimized, or reduced. This is explained in detail below.

Figure 10A:
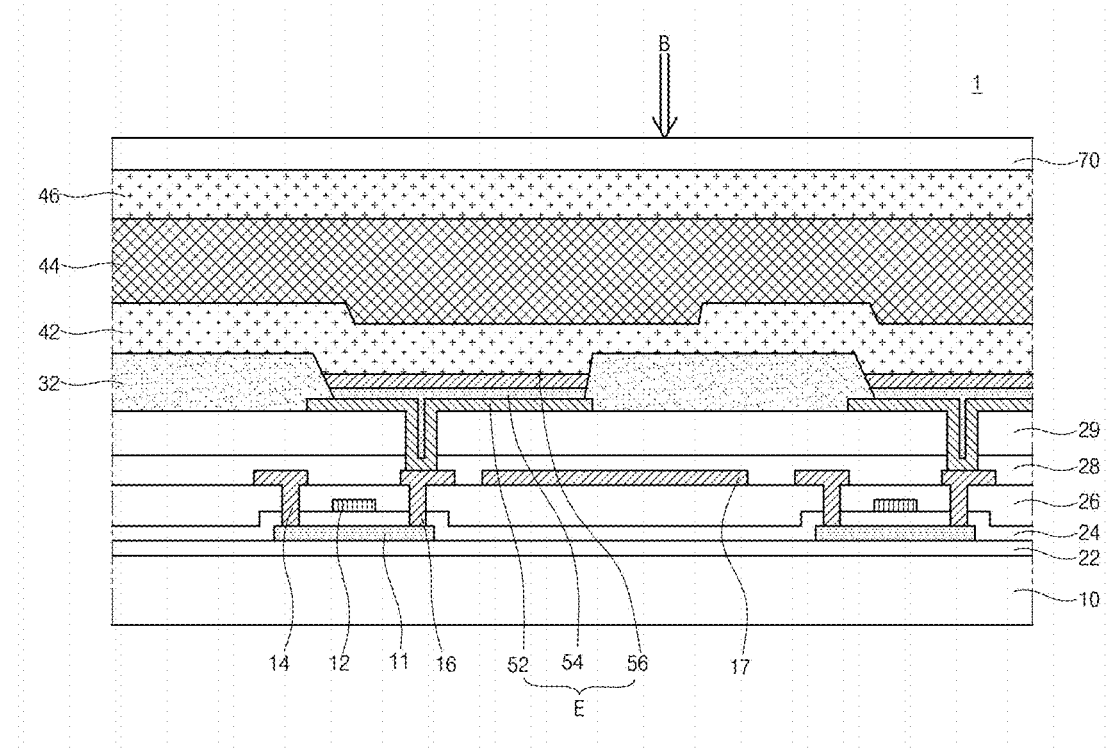
FIG. 10A is a cross-sectional view illustrating a flexible OLED device of a general structure in which no bending region is formed.
Figure 10B:
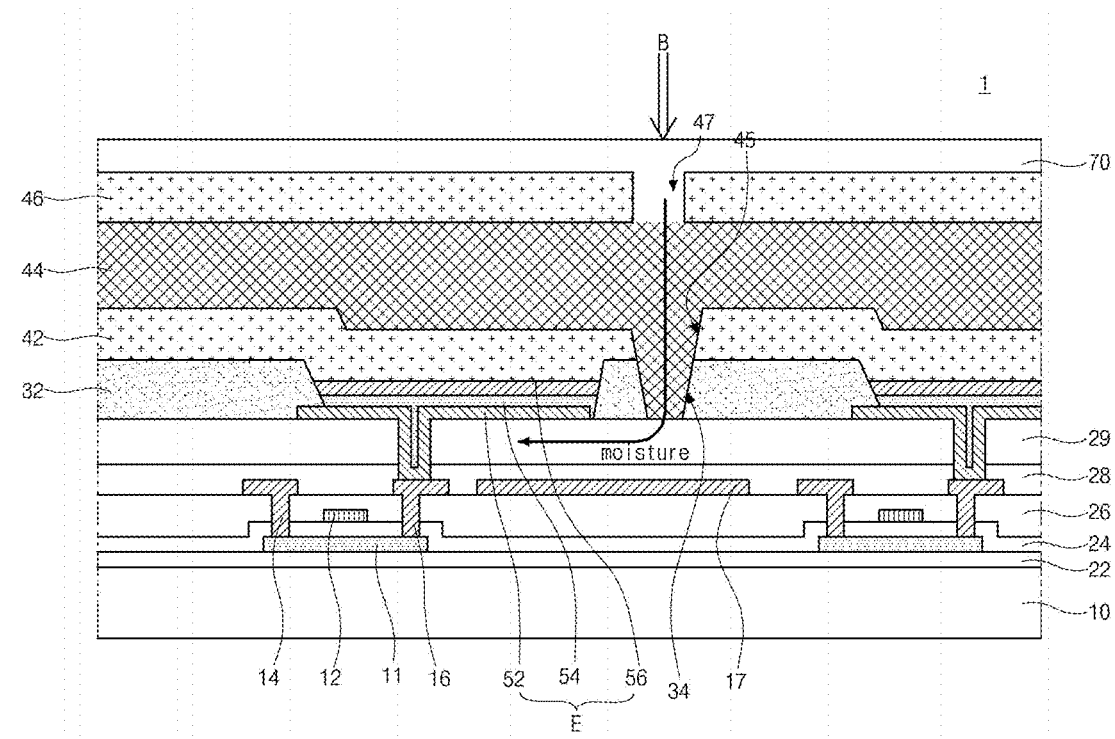
FIG. 10B is a cross-sectional view illustrating a flexible OLED device in which a structure of a bending region is removed.

FIG. 10A is a cross-sectional view illustrating a flexible OLED device of a general structure in which no bending region is formed. FIG. 10B is a cross-sectional view illustrating a flexible OLED device in which a structure of a bending region is removed. An advantage of the flexible OLED device 200 of this example embodiment is explained further with reference to FIGS. 10A and 10B. As illustrated in FIG. 10A, in the flexible OLED device 1 of a general structure, a planarization layer 29 on which an organic light emitting diode E may be entirely over a first substrate 10. Further, a bank 32 may be formed on the planarization layer 29 between neighboring sub-pixels, e.g., between neighboring organic light emitting diodes E. A first encapsulation layer 42 and a third encapsulation layer 46 may be formed entirely over the first substrate 10. Further, a second substrate 70 may be coupled to the third encapsulation layer 46 by a filling member (not shown).

In this flexible OLED device 1, a continuous and repetitive stress may be produced by a curving, and this stress may be applied to the first and third encapsulation layers 42 and 46. Thus, due to the continuous and repetitive stress, the first and third encapsulation layers 42 and 46 may be destroyed and cracks may be produced, and the cracks may be propagated over an entire region of the flexible OLED device 1. Thus, a durability of the flexible OLED device 1 may be reduced, and further, the flexible OLED device 1 may be destroyed.

As illustrated in FIG. 10B, in the flexible OLED device 1, the first and third encapsulation layers 42 and 46 may be removed at a bending region B where the continuous and repetitive stress may be applied. Because the first and third encapsulation layers 42 and 46 to which the continuous and repetitive stress may be applied do not exist, no cracks are produced at the first and third encapsulation layers 42 and 46, and a defect due to a propagation of the cracks may be minimized or reduced. However, in this structure, external moisture and air permeate through a region where the first and third encapsulation layers 42 and 46 may be removed. The permeating moisture and air may be propagated to the organic light emitting diode E through the planarization layer 29, and the organic light emitting diode E may be degraded.

In this example embodiment, because the first and third encapsulation layers 242 and 246 are not formed at the bending region B, cracks of the first and third encapsulation layers 242 and 246 due to the continuous and repetitive stress may not be produced, and thus a defect due to a propagation of the cracks can be minimized or reduced. Further, because the planarization layer 229 as a permeation path of moisture and air may be completely encapsulated by the first and third encapsulation layers 242 and 246, a permeation path of moisture and air can be blocked, and thus a degradation of the organic light emitting diode E can be resolved.

Figure 11:
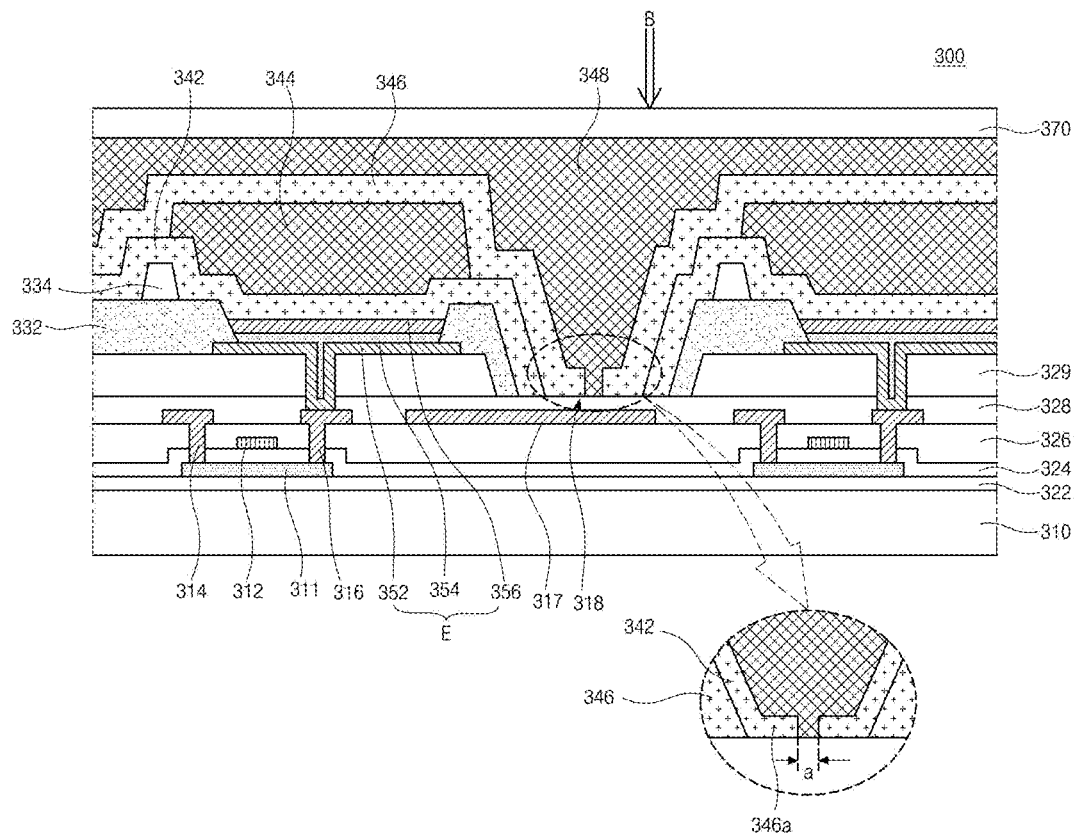
FIG. 11 is a cross-sectional view illustrating an OLED device according to a fifth example embodiment of the present disclosure.

FIG. 11 is a cross-sectional view illustrating an OLED device according to a fifth example embodiment of the present disclosure. As illustrated in FIG. 11, in the flexible OLED device 300, a planarization layer 329 of a bending region B may be removed to form an opening 318. A bank 332, a first encapsulation layer 342, and a third encapsulation layer 346 may extend inside the opening 318. Accordingly, the bank 332, the first encapsulation layers 342, and the third encapsulation layers 346 may not be formed at the bending region B. Thus, cracks of the first and third encapsulation layers 342 and 346 due to a continuous and repetitive stress caused by a curving may be not produced. Therefore, a reduction of durability or defect of the flexible OLED device 300 due to a propagation of the cracks may be minimized or reduced.

Further, in this example embodiment, the bank 332 and the first and third encapsulation layers 342 and 346 may be formed at both side surfaces of the opening 318, e.g., wall surfaces of the planarization layer 329 of sub-pixels that may be adjacent to each other with the opening 318 therebetween. Thus, the bank 332 and the first and third encapsulation layers 342 and 346 may completely seal the side surfaces (e.g., removed surfaces) of the planarization layer 329 at the bending region B. A permeation of external moisture and air through the opening 318 of the bending region B may be completely blocked, and thus a degradation of the organic light emitting diode E due to impurities such as moisture and air may be minimized or reduced.

Particularly, in this example embodiment, the third encapsulation layer 346 located at an outermost portion of the planarization layer 329 of the opening 318 may have a step 346a that may be located, on a top surface of the passivation layer 328 which may be a bottom of the opening 318, at a predetermined width. Accordingly, compared with the flexible OLED device of the fourth example embodiment, a contact area of the third encapsulation layer 346 with the top surface of the passivation layer 328 may increase, and a permeation of moisture and air through an interface between the passivation layer 328 and the third encapsulation layer 346 may be minimized or reduced effectively. Further, by the steps 346a located at both sides of the opening 318, a width a of the passivation layer 328 exposed may be further reduced, compared with the flexible OLED device of the fourth example embodiment. Thus, a permeation of moisture and air into a TFT through the passivation layer 328 may be effectively blocked.

Figure 12:
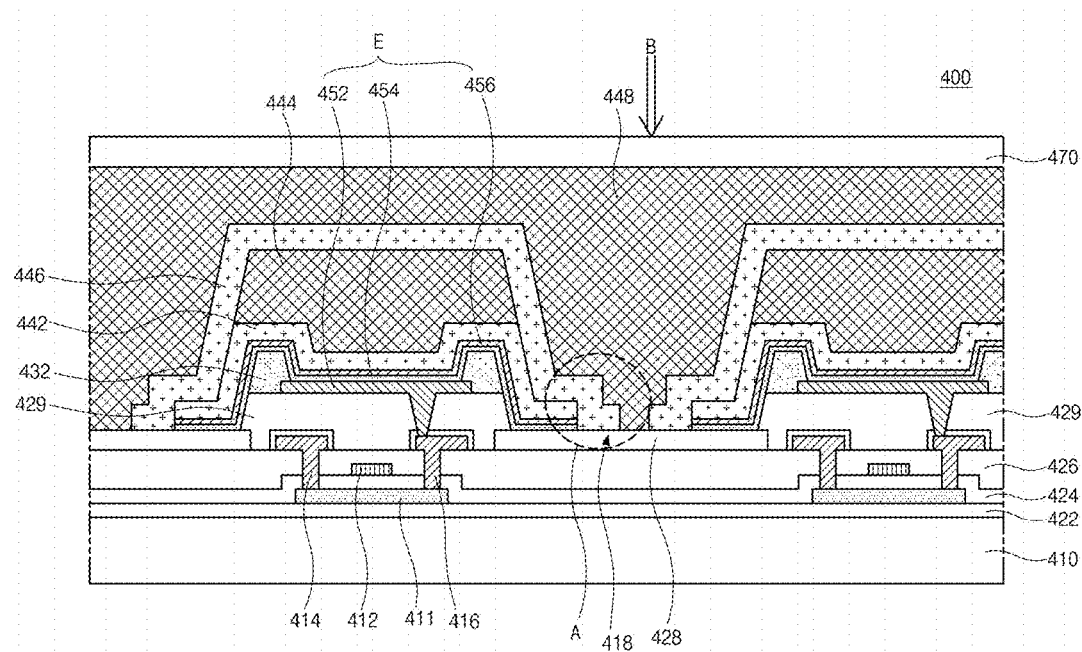
FIG. 12 is a cross-sectional view illustrating an OLED device according to a sixth example embodiment of the present disclosure.
Figure 13:
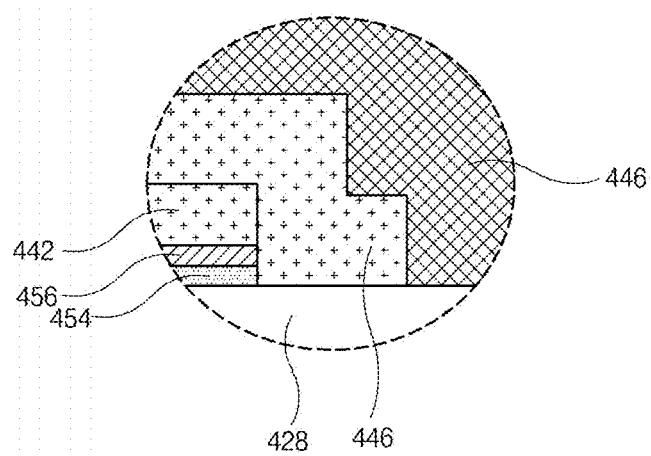
FIG. 13 is a cross-sectional view enlarging a region A of FIG. 12.

FIG. 12 is a cross-sectional view illustrating an OLED device according to a sixth example embodiment of the present disclosure. FIG. 13 is a view enlarging a region A of FIG. 12. As illustrated in FIGS. 12 and 13, in the flexible OLED device 400, a planarization layer 429 of a bending region B may be removed to form an opening 418, and a bank 432, a first encapsulation layer 442 and a third encapsulation layer 446 may extend inside the opening 418. Accordingly, the bank 432, the first encapsulation layers 442 and the third encapsulation layers 446 may not be formed at the bending region B, thus cracks of the first and third encapsulation layers 442 and 446 due to a continuous and repetitive stress caused by a curving may be not produced. Thus, a reduction of durability or destruction of the flexible OLED device 400 due to a propagation of the cracks may be minimized or reduced.

Further, in this structure, an organic light emitting layer 454 and a second electrode 456 of an organic light emitting diode E may extend to the passivation layer 428 along a side surface (e.g., a cut surface) of the opening 418, and the first encapsulation layer 442 may be formed on the second electrode 456. Further, a second encapsulation layer 444 may be formed in an island shape on the first encapsulation layer 442 over the organic light emitting diode E. Parts of the organic light emitting layer 454, the second electrode 456, and the first encapsulation layer 442 may form steps. These steps may be on the passivation layer 428 in the opening 418, and/or on side end surfaces of the organic light emitting layer 454. The second electrode 456 and the first encapsulation layer 442 forming the steps may be exposed in the opening 418.

The third encapsulation layer 446 may extend from a side surface of the first encapsulating layer 442 in the opening 418 to the passivation layer 428, and may seal the side end surfaces of the organic light emitting layer 454, the second electrode 456, and the first encapsulation layer 442. A part of the third encapsulation layer 446 may form a step 446a on the passivation layer 428 in the opening 418. Accordingly, the organic light emitting layer 454, the second electrode 456, and the first and third encapsulation layers 442 and 446 may be formed at a wall surface of the planarization layer 429 of the sub-pixel, and thus may completely seal the side surface (e.g., a removed surface) of the planarization layer 429 at the bending region B. A permeation of external moisture and air through the opening 418 of the bending region B may be completely blocked, and thus a degradation of the organic light emitting diode E due to impurities such as moisture and air may be minimized or reduced.

Further, the side end surfaces of the organic light emitting layer 454 and the second electrode 456 exposed in the opening 418 may be encapsulated by the third encapsulation layer 446, and thus a permeation of moisture and air through the side end surfaces of the organic light emitting layer 454 and the second electrode 456 may be minimized or reduced. Further, in this example embodiment, the third encapsulation layer 446 encapsulating the side end surfaces of the organic light emitting layer 454 and the second electrode 456 may have a step 446a of a predetermined width. Accordingly, a contact area of the third encapsulation layer 446 with the top surface of the passivation layer 428 may increase, and thus a permeation of moisture and air through an interface between the passivation layer 428 and the third encapsulation layer 446 may be minimized or reduced further effectively. Further, by the steps 446a located at both sides of the opening 418, a width of the passivation layer 428 exposed may be reduced. Thus, a permeation of moisture and air into a TFT through the passivation layer 428 may be effectively blocked.

Figure 14:
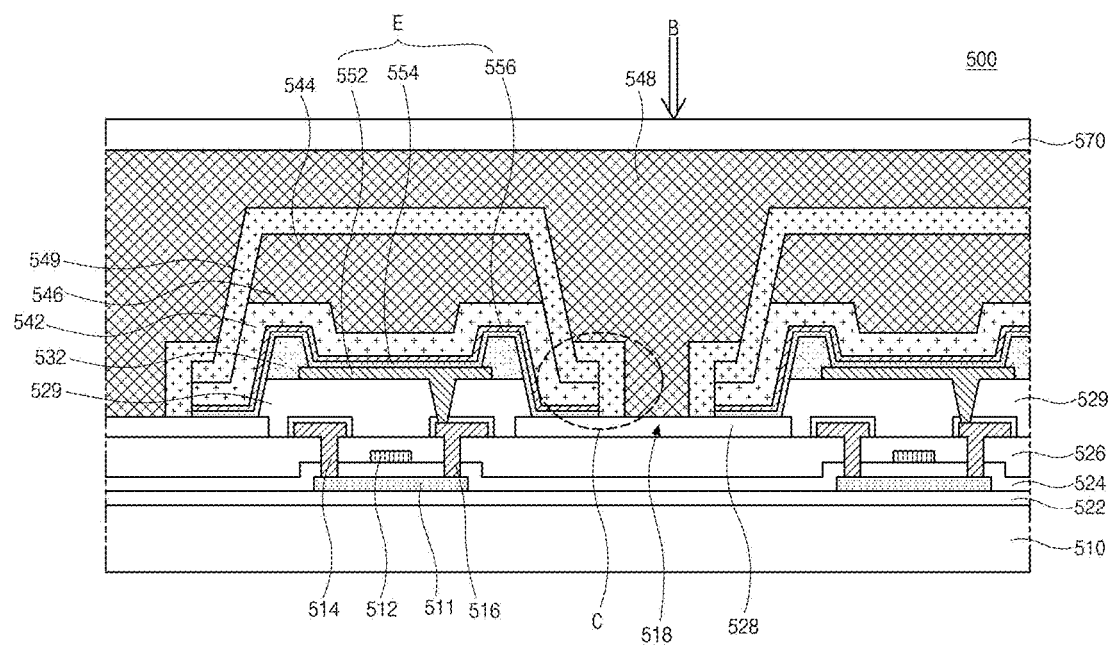
FIG. 14 is a cross-sectional view illustrating an OLED device according to a seventh example embodiment of the present disclosure.
Figure 15:
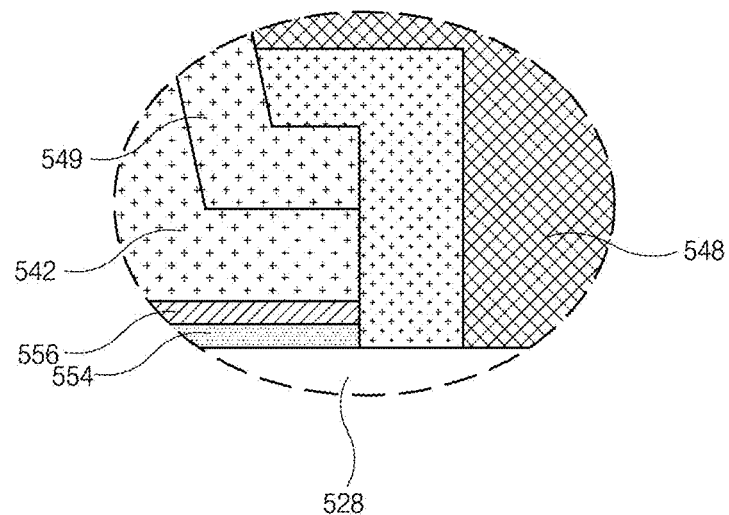
FIG. 15 is a cross-sectional view enlarging a region C of FIG. 14.

FIG. 14 is a cross-sectional view illustrating an OLED device according to a seventh example embodiment of the present disclosure. FIG. 15 is a view enlarging a region C of FIG. 14. As illustrated in FIGS. 14 and 15, in the flexible OLED device 500, a planarization layer 529 of a bending region B may be removed to form an opening 518, and a bank 532, a first encapsulation layer 542 and a third encapsulation layer 546 may extend inside the opening 518. Accordingly, the bank 532, the first encapsulation layers 542 and the third encapsulation layers 546 may not be formed at the bending region B, thus cracks of the first and third encapsulation layers 542 and 546 due to a continuous and repetitive stress caused by a curving may be not produced. Thus, a reduction of durability or destruction of the flexible OLED device 500 due to a propagation of the cracks may be minimized or reduced.

Further, in this structure, an organic light emitting layer 554 and a second electrode 556 of an organic light emitting diode E may extend to the passivation layer 528 along a side surface (e.g., a cut surface) of the opening 518, and the first encapsulation layer 542 may be formed on the second electrode 556. Further, a second encapsulation layer 544 may be formed in an island shape on the first encapsulation layer 542 over the organic light emitting diode E, and the third encapsulation layer 546 may be formed on the first and second encapsulation layers 542 and 544. Parts of the organic light emitting layer 554, the second electrode 556, the first encapsulation layer 542, and the third encapsulation layer 546 may form steps. These steps may be on the passivation layer 528 in the opening 518, and side end surfaces of the organic light emitting layer 554, the second electrode 556, the first encapsulation layer 542, and the third encapsulation layer 546, thereby forming the steps that may be exposed in the opening 518.

A fourth encapsulation layer 549 may be formed on the third encapsulation layer 546, and on the side surfaces of the organic light emitting layer 554, the second electrode 556, the first encapsulation layer 542. The fourth encapsulation layer 549 may be made of an inorganic material, and may encapsulate the exposed side end surfaces of the organic light emitting layer 554, the second electrode 556, the first encapsulation layer 542, and the third encapsulation layer 546. Accordingly, the organic light emitting layer 554, the second electrode 556 and the first, third, and fourth encapsulation layers 542, 546, and 549 may be formed at a wall surface of the planarization layer 529 of the sub-pixel, and thus may completely seal the side surface (e.g., a removed surface) of the planarization layer 529 at the bending region B. A permeation of external moisture and air through the opening 518 of the bending region B may be completely blocked, and thus a degradation of the organic light emitting diode E due to impurities such as moisture and air may be minimized or reduced.

Further, the side end surfaces of the organic light emitting layer 554 and the second electrode 556 exposed in the opening 518 may be encapsulated by the fourth encapsulation layer 549, and thus a permeation of moisture and air through the side end surfaces of the organic light emitting layer 554 and the second electrode 556 may be minimized or reduced. Further, in this example embodiment, three-layered inorganic encapsulation layers 542, 546, and 549 may be formed on the organic light emitting layer 554 and the second electrode 556 located at the opening 518, and thus a permeation of external moisture and air may be blocked further. Further, by the steps located at both sides of the opening 518, a width of the passivation layer 528 exposed may be reduced. Thus, a permeation of moisture and air into a TFT through the passivation layer 528 may be effectively blocked.

In the above fourth to seventh example embodiments, a destruction of a bending region of the flexible OLED display region due to a continuous and repetitive stress can be minimized or reduced, and a permeation of impurities such as moisture and air through the bending region can be minimized or reduced. As illustrated in FIG. 14, a foldable OLED device 600 may not be curved over an entire of the device, but may be folded at a certain portion so that it may be used in a folded state and an unfolded state as needed. Accordingly, the OLED device 600 may include a folding region F that may be folded and a flat region P that may not be folded. A bending region B where the OLED device 600 is actually bent may be produced at the folding region F, and may not be produced at the flat region P. In the drawings, the OLED device 600 folded in one direction may be illustrated by way of example. However, the OLED device 600 may be in both of a long side direction and a short side direction. Further, one or more folding regions F may be formed. If two or more folding regions F are formed, the OLED device 600 may be folded at positions of the folding regions F.

Figure 16:
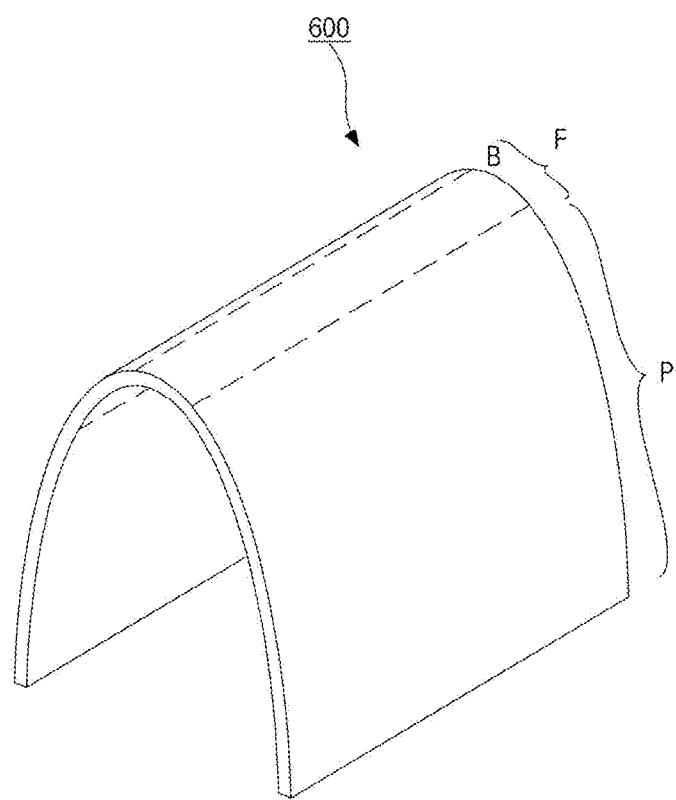
FIG. 16 illustrates a foldable OLED device according to an eighth example embodiment of the present disclosure.
Figure 17:
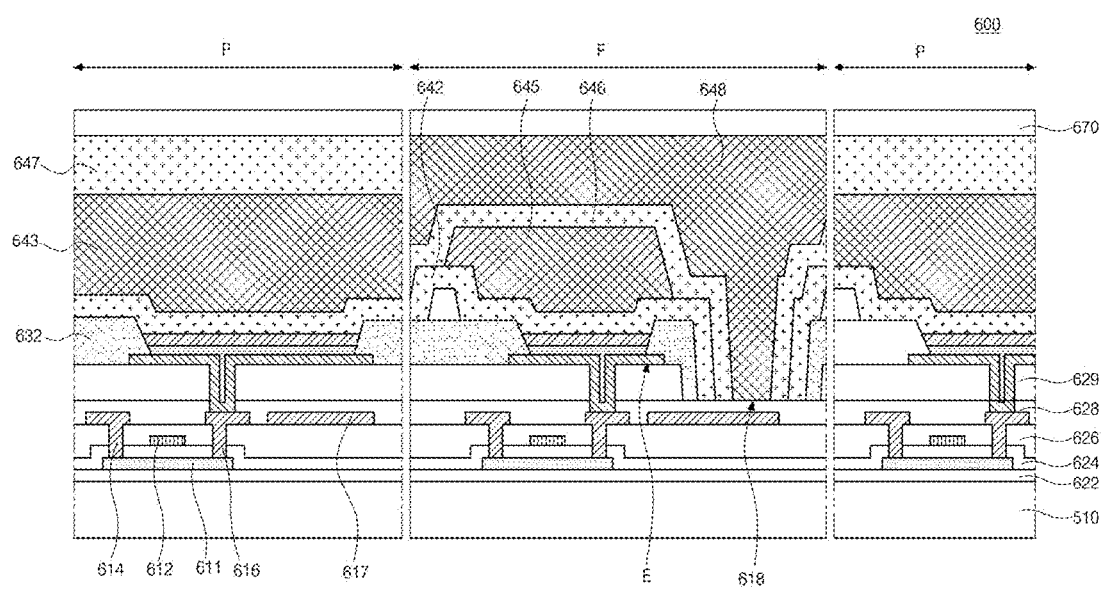
FIG. 17 is a cross-sectional view illustrating a foldable OLED device according to an eighth example embodiment of the present disclosure.

FIG. 17 is a view illustrating a structure of a foldable OLED device of FIG. 16. As illustrated in FIG. 17, the foldable OLED device 600 may include a folding region F and a flat region P, and a bending region B may be formed in the folding region F. In a sub-pixel located in each of the folding region F and the flat region P, a TFT including a semiconductor layer 611, a gate electrode 612 and source and drain electrodes 614 and 616 may be formed. A passivation layer 628 and a planarization layer 629 may be formed on the TFT.

A bank 632 may be formed on the planarization layer 629 between neighboring sub-pixels, and an organic light emitting diode E may be formed between neighboring banks 632. The organic light emitting diode E may include a first electrode, a second electrode, and an organic light emitting layer between the first and second electrodes. A first encapsulation layer 642, a second encapsulation layer 644 and a third encapsulation layer 646 may be formed on the first substrate 610 having the organic light emitting diode E. The first and third encapsulation layers 642 and 646 may be formed of an inorganic material, and the second encapsulation layer 644 may be formed of an organic material.

In the flat region P, the first encapsulation layer 642, the second encapsulation layer 644 and the third encapsulation layer 646 may be sequentially formed. In the folding region F, an opening 618 where a part of the planarization layer 629 is removed may be formed, and the first encapsulation layer 642 and the third encapsulation layer 646 may be formed along a wall surface of the opening 618 to completely encapsulate a side surface of sub-pixel. Further, in the folding region F, the second encapsulation layer 644 may be formed in an island shape on the first encapsulation layer 642, and the second encapsulation layer 644 may be completely encapsulated by the first encapsulation layer 642 and the third encapsulation layer 646. Further, a filling member 648 may be coated on the third encapsulation layer 646, and a second substrate 670 may be located on the filling member 648. The first and second substrates 610 and 670 may be coupled to each other using the filling member 648. In the folding region F, the filling member 648 may fill an inside of the opening 618.

In the foldable OLED device 600 of this example embodiment, the opening 618 may not be formed in the flat region P, and the first encapsulation layer 642, the second encapsulation layer 644, and the third encapsulation layer 646 may be sequentially formed entirely over the flat region P. The opening 618 may be formed in the folding region F, and the first encapsulation layer 642, the second encapsulation layer 644, and the third encapsulation layer 646 may not be formed at a region of the opening 618. Accordingly, when folding the foldable OLED device 600 at the folding region F, occurrence of cracks produced in the first encapsulation layer 642, the second encapsulation layer 644, and the third encapsulation layer 646 may be avoided, and thus a destruction of the foldable OLED device 600 due to a propagation of the cracks may be minimized or reduced.

Further, in the foldable OLED device 600 of this example embodiment, the wall surface the opening 618 of the folding region F may be completely encapsulated by the first and third encapsulation layers 642 and 646, and thus a permeation of moisture and air into the organic light emitting diode E through the folding region F may be minimized or reduced. As such, in the foldable OLED device 600 of this example embodiment, a continuous and repetitive stress by a curving or folding may not be applied to the flat region P and not folded. Therefore, the flat region P may have a structure as illustrated in FIG. 10A. The folding region F, which a continuous and repetitive stress by a curving or folding may be applied to, may have a structure to prevent a destruction by the stress and a permeation of impurities as illustrated in FIG. 8. Alternatively, the folding region F may have a structure as illustrated in FIG. 11, 12 or 14. Alternatively, both of the flat region P and the folding region F may have a structure as illustrated in FIG. 8, 11, 12 or 14.

Figure 18:
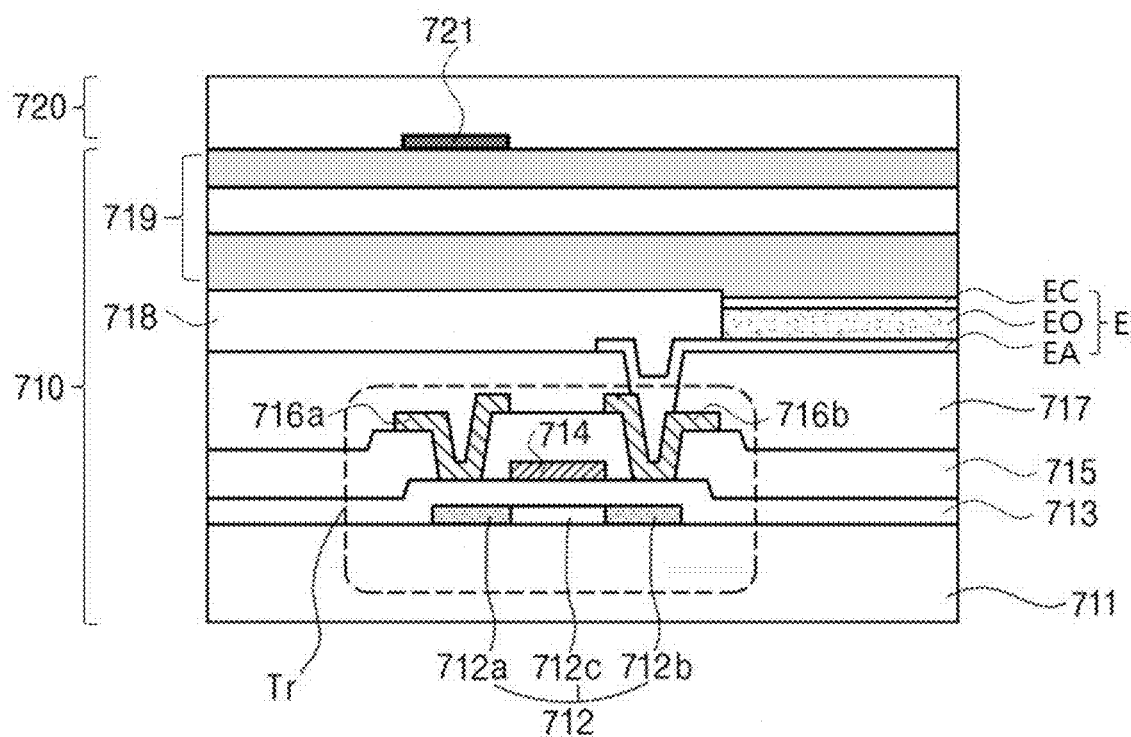
FIG. 18 is a cross-sectional view illustrating an OLED panel including a touch panel.

FIG. 18 is a cross-sectional view illustrating an OLED panel including a touch panel. As illustrated in FIG. 18, an OLED panel may include a display panel 710 and a touch panel 720. A semiconductor layer 712 including an active region 712c and source and drain regions 712a and 712b may be formed on a first substrate 711 (or an array substrate). A gate insulating layer 713 may be formed on the semiconductor layer 712. A gate electrode 714, an inter-layered insulating layer 715, and source and drain electrodes 716a and 716b may be formed on the gate insulating layer 713. The semiconductor layer 712, the gate insulating layer 713, the gate electrode 714, the inter-layered insulating layer 715, and the source and drain electrodes 716a and 716b may form a TFT Tr.

A passivation layer 717 and an organic light emitting diode E may be sequentially formed on the TFT Tr. The organic light emitting diode E may include an anode (or a first electrode) EA, an organic insulating layer EO, and a cathode (or a second electrode) EC. A bank 718 may enclose (or surround) side surfaces of the organic light emitting diode E. An encapsulation layer 719 of a multiple-layer structure using an organic layer and an inorganic layer may be formed on the organic light emitting diode E to prevent a permeation of moisture into the organic light emitting diode E.

A touch panel 720 may include a touch electrode 721, a Tx line (or a touch driving line) (not shown) transferring a touch input driving signal, a Rx line (or a touch sensing line) (not shown) transferring a touch input sensing signal, and a driving power line supplying a driving power to the touch electrode. The touch panel 720 may be formed on the encapsulation layer 719. The touch panel 720 may process a user's touch input to a display. However, because the touch panel 720 including the touch electrode 721 may be formed on the encapsulation layer 719, a thickness of an OLED device increases. As a flexible display, which may be any one of various types such as a bendable type, a rollable type, a foldable type, and/or a curved type, increases in thickness, a deformable range may be reduced and thus a flexibility may be reduced. Further, to include a touch panel driving circuit that supplies the touch input driving signal to the Tx line and receives the touch input sensing signal from the Rx line, a separate space for the touch panel driving circuit may be needed to be provided in a bezel region of a display. This hinders a use of space in a small-sized flexible OLED device.

Figure 19A:
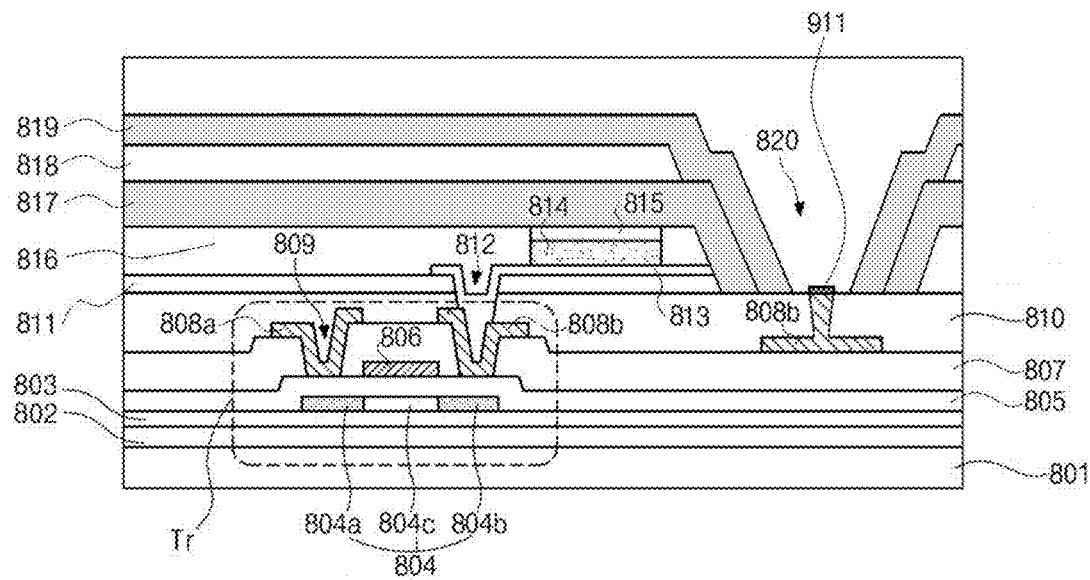
FIG. 19A is a cross-sectional view illustrating an OLED panel according to a ninth example embodiment of the present disclosure.

FIG. 19A is a cross-sectional view illustrating an OLED panel according to a ninth example embodiment of the present disclosure. To realize a flexible display using an OLED panel, a first substrate 801 (or an array substrate) may be made of a plastic material having a flexibility. The plastic material may be polyimide. A multi-buffer layer 802 as a buffer layer may be formed on the first substrate 801. The multi-buffer layer 802 may prevent a permeation of moisture, oxygen and other substances from the first substrate 801. The multi-buffer layer 802 may be formed with a layer of SiNx and a layer of SiOx alternately stacked.

An active buffer layer 803 as another buffer layer may be formed on the multi-buffer layer 802. The active buffer layer 803 may protect a semiconductor layer 804 and block a permeation of moisture, oxygen and other substances from the first substrate 801. The active buffer layer 803 may be formed of an amorphous silicon. The semiconductor layer 804 may be formed on the active buffer layer 803. The semiconductor layer 804 may be formed of an amorphous silicon, a polycrystalline silicon, and/or an oxide semiconductor material. An active region 804c as a channel may be located at a center portion of the semiconductor layer 804, and source and drain regions 804a and 804d highly doped with impurities may be located at both sides of the active region 804c.

A gate insulating layer 805 may be formed on the semiconductor layer 804. The gate insulating layer 805 may block a current flow between the semiconductor layer 804 and a gate electrode 806. The gate insulating layer 805 may be formed of an inorganic insulating material, for example, SiOx or SiNx, or an organic insulating material. The gate electrode 806 may be formed on the gate insulating layer 805 corresponding to the active region 804c. A gate line (not shown) extending along a direction may be formed on the gate insulating layer 805. The gate electrode 806 may be formed of Mo, Al, Cr, Au, Ti, Ni, Nd, Cu, and/or an alloy thereof. The gate electrode may have a single-layered or multiple-layered structure.

An inter-layered insulating layer 807 may be formed on the gate electrode 806 and the gate line. The inter-layered insulating layer 807 may be made of an inorganic insulating material, for example, SiOx and/or SiNx, or an organic insulating material. The inter-layered insulating layer 807 may have a contact hole 809 exposing each of the source and drain regions 804a and 804b of the semiconductor layer 804. Source and drain electrodes 808a and 808b may be formed on the inter-layered insulating layer 807. The source and drain electrodes 808a and 808b may be made of Mo, Al, Cr, Au, Ti, Ni, Nd Cu, and/or an alloy(s) thereof. The source and drain electrodes 808a and 808b may have a single-layered or multiple-layered structure.

The semiconductor layer 804, the gate insulating layer 805, the gate electrode 806, the inter-layered insulating layer 807, and the source and drain electrodes 808a and 808b may form a TFT Tr. A passivation layer 810 may be formed on the source and drain electrodes 808a and 808b. The passivation layer 810 may protect the source and drain electrodes 808a and 808b from moisture, oxygen, and other substances. A planarization layer 811 may be formed on the passivation layer 810. The planarization layer 811 may protect the TFT Tr and planarize a surface of the first substrate 801. The planarization layer 811 may be made of at least one of polyacrylates resin, epoxy resin, phenolic resin, polyamides resin, polyimides resin, unsaturated polyesters resin, polyphenylenethers resin, polyphenylenesulfides resinn and/or benzocyclobutene (BCB). The planarization layer 811 may have a single-layered or multiple-layered structure.

Parts of the passivation layer 810 and the planarization layer 811 may be removed to form a drain contact hole 812, thereby exposing the drain electrode 808b. A first electrode 813 may be formed on the planarization layer 811 and serve as an anode of an organic light emitting diode. The first electrode 813 may be electrically connected to the drain electrode 808b of the TFT Tr through the drain contact hole 812. If the OLED device is a bottom emission type, the first electrode 813 may be made of a transparent conductive material, for example, ITO and/or IZO. If the OLED device is a top emission type, the first electrode 813 may be made of an opaque conductive material having a high reflectance, for example, Ag, Al, Au, Mo, W, Cr, and/or an alloy(s) thereof.

An organic light emitting layer 814 may be located on the first electrode 813. The organic light emitting layer 814 may be formed with a single layer made of an emitting material. Alternatively, to increase an emission efficiency, the organic light emitting layer 814 may be formed with multiple layers that may include a hole injection layer, a hole transport layer, an emitting material layer, an electron transport layer and an electron injection layer. The organic light emitting layer 814 may emit red, green or blue light. In this regard, red, green and blue organic materials may be patterned respectively in red, green and blue sub-pixels.

A second electrode 815 may be located on the organic light emitting layer 814 and serve as a cathode of the organic light emitting diode. If the OLED device is a top emission type, the second electrode 815 may be made of a transparent conductive material, for example, ITO and/or IZO. If the OLED device is a bottom emission type, the second electrode 815 may be made of an opaque conductive material having a high reflectance, for example, Ag, Al, Au, Mo, W, Cr, and/or an alloy(s) thereof. When the first and second electrodes 813 and 815 are applied with respective voltages according to a data signal input to the TFT Tr, a hole from the first electrode 813 and an electron from the second electrode 815 may be transported to the organic light emitting layer 814 and form an exciton. When a transition of the exciton from an excited state to a ground state occurs, a light may be produced and emitted. The emitted light may pass through the first or second electrode 813 or 815, and thus the OLED device may display an image.

A bank 816 may be formed at a side of the organic light emitting diode. The bank 816 may have a structure separated by sub-pixel. The bank 816 may be made of an inorganic insulating material, for example, SiOx or SiNx, or an organic insulating material, for example, BCB, acryl resin or imides resin. An encapsulation layer may be formed on the bank 816 and the second electrode 815, and may include a first encapsulation layer 817, an organic layer 818 and a second encapsulation layer 819 that may be sequentially located on the bank 816 and the second electrode 815. Each of the first encapsulation layer 817 and the second encapsulation layer 819 may be made of SiOx, SiNx, and/or AlOx and may serve to prevent a permeation of moisture, oxygen, and/or other substances into the organic light emitting layer 814.

The organic layer 818 of an organic material may be between the first and second encapsulation layers 817 and 819 to planarize a surface of the substrate, and thus a reduction of a display quality caused by a step being produced may be prevented. The inorganic encapsulation layers of the first and second encapsulation layers 817 and 819, and the organic layer 818 being stacked alternately is described by way of example. Alternatively, a plurality of organic layers and a plurality of inorganic encapsulation layers may be stacked alternately, and a permeation of moisture, oxygen, and/or other substances into the organic light emitting layer 814 may be prevented.

The encapsulation layer may be formed in a thin film form with an organic layer and an inorganic layer so that the encapsulation layer may be lighter and/or thinner than an encapsulation layer of glass and has a flexibility. Thus, the encapsulation layer of this example embodiment may be applied to the flexible OLED device. A capsulation hole (or a capsulation contact hole) 820 may be formed in a region of the bank 816 where the organic light emitting diode may not be formed, and the encapsulation hole 820 may expose the passivation layer 810 therebelow. To expose the passivation layer 810, the encapsulation hole 820 may be formed in the planarization layer 811, the bank 816, the first encapsulation layer 817, the organic layer 818, and the second encapsulation layer 819. For example, the planarization layer 811, the bank 816, the first encapsulation layer 817, the organic layer 818, and the second encapsulation layer 819 may be removed sequentially to form the encapsulation hole 820 therein.

A periphery of the encapsulation hole 820 may be surrounded by the first and second encapsulation layers 817 and 819. A touch electrode 911 may be formed on a part of the passivation layer 810 exposed in the encapsulation hole 820. The drain electrode 808b of the TFT Tr may extend to a region of the exposed part of the passivation layer 810 and be connected to the touch electrode 911. Alternatively, the touch electrode 911 may be connected to a signal line formed on the first substrate 801. The touch electrode 911 may receive a touch input driving signal through a data line, which may be electrically connected to the TFT Tr, and/or through the signal line formed on the first substrate 801. When a touch input is sensed, a touch input sensing signal may be transferred from the touch electrode 911 through the data line or the signal line formed on the first substrate 801, and then the touch input may be processed.

In this example embodiment, a touch panel may not be formed on the second encapsulation layer 819. The touch panel may include a touch electrode, a Tx line, and a Rx line. Without forming the touch panel, the first encapsulation layer 817, the organic layer 818, and the second encapsulation layer 819 may be removed to form the encapsulation hole 820. Also, the touch electrode 811 may be formed in the encapsulation hole 820. By eliminating a touch panel on an encapsulation layer, a total thickness of the OLED panel may be reduced. Further, as a thickness of the OLED panel may be reduced, a deformable range may increase, thus it may be easy to make the OLED panel in a bendable type, rollable type, foldable type, or curved type, and thus the OLED panel may have a structure suitable to a flexible display.

Further, signals lines including a data line may be used as a Tx line and a Rx line, the Tx line and/or the Rx line may be eliminated on an encapsulation layer. Accordingly, a touch panel driving circuit, which supplies a touch input driving signal to the Tx line and receives a touch input sensing signal from the Rx line, may be not needed to be provided in a bezel region of a side surface portion of the OLED panel, and thus a size of the bezel region may be reduced. As the bezel region is reduced, a use of space may be better, and a flexible OLED device in various designs may be realized. Further, a driving power to drive the touch electrode 911 may be supplied through a signal line formed on the first substrate, and thus a driving power line located on an encapsulation layer may be eliminated.

Figure 19B:
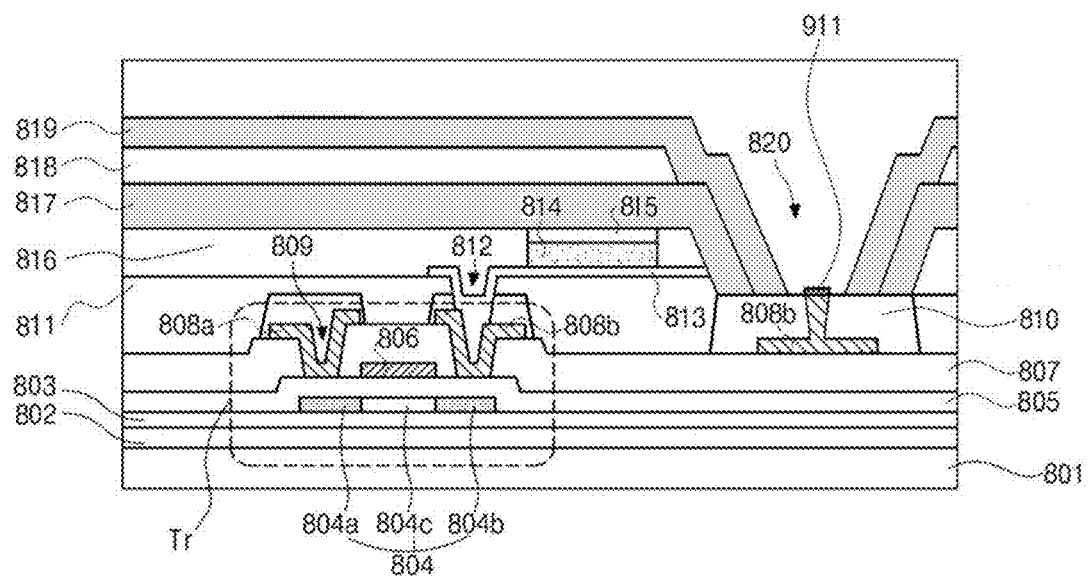
FIG. 19B is a cross-sectional view illustrating an OLED panel according to a tenth example embodiment of the present disclosure.

FIG. 19B is a cross-sectional view illustrating an OLED panel according to a tenth example embodiment of the present disclosure. A difference of the OLED panel this example embodiment from that of the ninth example embodiment is that the passivation layer 810 of this example embodiment may be formed to have an island shape (or separated structure) corresponding to the source electrode 808a and the drain electrode 808b. For example, the passivation layer 810 may be an island pattern (or separate pattern) that is located on and cover each of the source electrode 808a and the drain electrode 808b. This configuration may relieve a stress of the passivation layer 810, and may prevent cracks and a propagation of a stress caused by the cracks to other regions.

Like the ninth example embodiment, in this example embodiment, the encapsulation hole 820 may be formed and the touch electrode 911 may be located in the encapsulation hole 820, and thus a touch panel on an encapsulation layer may be eliminated. Accordingly, a flexibility may increase by reducing a thickness of the OLED panel, and a touch driving circuit may be eliminated from a bezel region thus a size of the bezel region may be reduced thus a use of space may increase, and a flexible OLED device may be realized.

Figure 20:
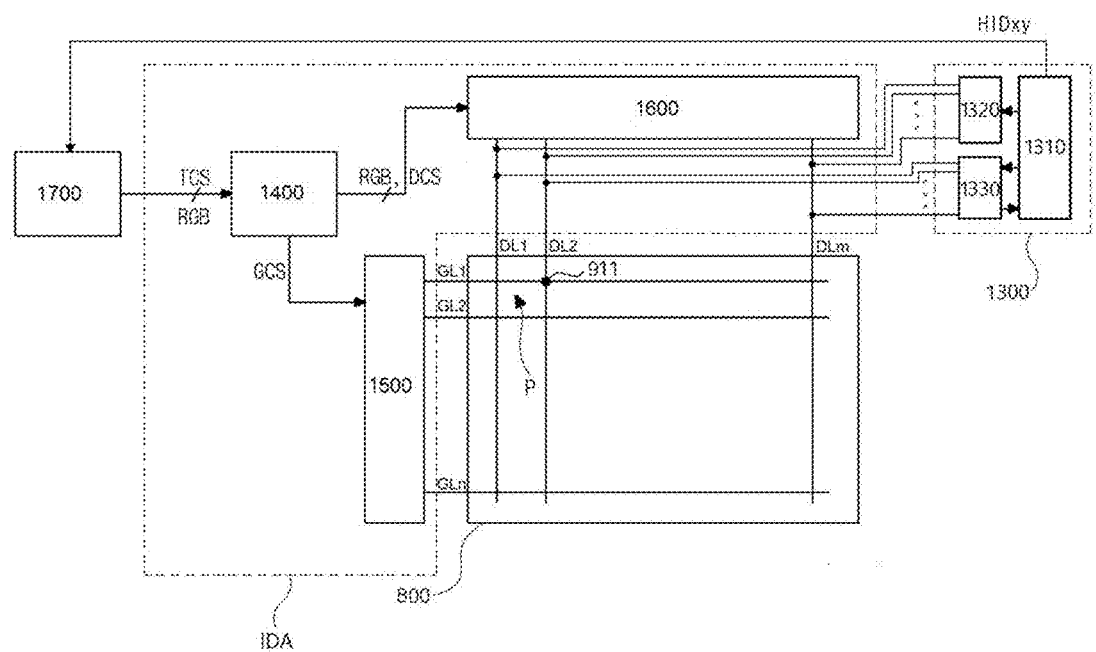
FIG. 20 illustrates an OLED device according to an eleventh example embodiment of the present disclosure.

FIG. 20 illustrates an OLED device according to an eleventh example embodiment of the present disclosure. As illustrated in FIG. 20, the OLED device may include a display panel 800, a touch panel driving portion 1300, a timing control portion 1400, a gate driving portion 1500, and a data driving portion 1600. The display panel 800 may include a plurality of sub-pixels P in a matrix form and display an image. The display panel 800 may use the OLED panel of the ninth or tenth example embodiment. On a first substrate of the display panel 800, a plurality of gate lines GL1 to GLn, which may be spaced apart from and in parallel to each other, and a plurality of data lines DL1 to GLm, which cross the gate lines GL1 to GLn to define the sub-pixels, may be formed.

The sub-pixel P may include an organic light emitting diode emitting a light, a TFT adjusting an amount of light emission of the organic light emitting diode according to a data signal, and a storage capacitor maintaining a voltage of the data signal until a next frame. A touch electrode 911 may be formed in an encapsulation hole (e.g., 820 of FIG. 19A or 19B) located in the sub-pixel P, and may sense a touch input. Types of sensing a touch input may be categorized into a resistive type, an electromagnetic type, or a capacitive type. The capacitive type may be a type of sensing a touch electrode in which a voltage changes according to a change of a capacitance by a touch and thus determining a position where a touch input may be made. In this example embodiment, a capacitive type is described by way of example.

The touch panel driving portion 1300 may transmit a touch input driving signal (TD), and receive a touch input sensing signal (RD) from the touch electrode 911 then convert the touch input sensing signal (RD) into a digital data (DD) and then process the touch input. To do this, the touch panel driving portion 1300 may include a touch input control portion 1310, a Tx driving portion 1320, and a Rx driving portion 1330. The touch input control portion 1310 may generate a first setup signal (SS1) to control the Tx driving portion 1320, and a second setup signal (SS2) to control the Rx driving portion 1330.

The touch input control portion 1310 may supply a switch control signal (SCS) to control a sampling timing to the Rx control portion 1330, and control the Rx control portion 1330 to conduct an sampling for the touch input sensing signal (RD) transferred from the touch electrode 911. Further, the touch input control portion 1310 may supply an ADC clock signal (AD_CLK) to an analog-to-digital converter (ADC) that may be included in the Rx driving portion 1330, and control the analog-to-digital converter to convert the sampled touch input sensing signal (RD) into the digital data (DD). Further, the touch input control portion 1310 may use the digital data (DD) and a touch input sensing algorithm and figure out (or determine) a coordinate where a touch input is made, and then transmit a touch input data HIDxy including the coordinate information to a host system 1700. The host system 1700 may process the touch input data HIDxy from the touch input control portion 1310 using an application program. The touch input control portion 1310 may be configured with a micro controller unit.

Various methods may be used for an algorithm with which a micro controller unit senses. For example, a digital data with an amount of a current flowing on a touch electrode may be stored as a reference data (R). A raw data (r) may be digital data converted by the Rx driving portion 1330 when an actual touch input may be conducted. The raw data (r) may be compared with the reference data (R). If the raw data (r) is smaller than the reference data (R), a touch input may not happen. If the raw data (r) is greater than the reference data (R), a touch input may happen. When it is determined that a touch input happens, the micro controller unit may generate the touch input data HIDxy including a position, where a touch input is made, and a identification code, and transmit the touch input data HIDxy to the host system 1700.

The Tx driving portion 1320 may set up a data line transferring the touch input driving signal (TD) of a driving pulse(s) according to the first setup signal (SS1), and transmit the touch input driving signal (TD) to the setup data line. The Rx driving portion 1330 may set up a data line transferring the touch input sensing signal (RD) according to the second setup signal (SS2). Further, the Rx driving portion 1330 may sample the touch input sensing signal (RD) according to the switch control signal (SCS) input from the touch input control portion 1310, then convert the sampled touch input sensing signal (RD) into the digital data (DD), and then transmit the digital data (DD) to the touch input control portion 1310. The Tx driving portion 1320 supplying the touch input driving signal (TD) to the touch electrode 911 and the Rx driving portion 1330 receiving the touch input sensing signal (RD) from the touch electrode, through the data line, is described by way of example. However, a signal line, formed on the first substrate, other than the data line may be used.

The touch electrode 911 formed at the encapsulation hole may receive the touch input driving signal (TD) from the Tx driving portion 1320 through the data line or other signal line on the first substrate. Then, the touch electrode 911 that senses a touch input may transmit the touch input sensing signal (RD) to the Rx driving portion 1330 through the data line or other signal line on the first substrate, and then the touch input may be processed. A touch input being sensed by a change of capacitance is described by way of example. However, functions of sensing at least one of heat, pressure, and/or moisture may be added to the touch electrode 911, and various additional functions may be realized.

The timing control portion 1400 may generate a gate control signal GCS to control an operation of the gate driving portion 1500, and a data control signal DCS to control an operation of the data driving portion 1600. These signals may be generated using a timing control signal TCS input from the host system 1700, and then may supply the gate control signal GCS and the data control signal DCS to the gate driving portion 1500 and the data driving portion 1600. Further, the timing control portion 1400 may supply an image signal RGB to the data driving portion 1600. The gate driving portion 1500 may shift a gate start pulse (GSP) included in the gate control signal GCS according to a gate shift clock (GSC) included in the gate control signal GCS, and supply a gate high signal (VGH), which turns on the TFT, sequentially to the gate lines GL1 to GLn. Further, the gate driving portion 1500 may supply a gate low signal (VGL) to the gate lines GL1 to GLn during a remaining time when the gate high signal (VGH) is not supplied.

The data driving portion 1600 may shift a source start pulse (SSP) included in the data control signal DCS according to a source shift clock (SSC) included in the gate control signal GCS to generate a sampling signal. Further, the data driving portion 1600 may latch the image data RGB, which may be input according to the source shift clock (SSC), according to the sampling signal. Then, the data driving portion may convert the latched image data RGB into a data signal, and then supply the image data signal by row line to the data lines DL1 to DLm in response to a source output enable (SOE) signal. The timing control portion 1400, the gate driving portion 1500, the data driving portion 1600 may operate the display panel 800, and may be included in a display panel driving portion IDA. Further, the Tx driving portion 1320 and the Rx driving portion 1330 as the touch panel driving circuit may be removed from a bezel region at a side of a display region and may be located at other non-display region, and thus a size of the bezel region may be reduced. Accordingly, a flexible OLED device with an increase of a use of space may be realized.

The above-described features, structure, and effect of the present disclosure are included in at least one example embodiment, but are not limited to only one example embodiment. Furthermore, the features, structure, and effect described in at least one example embodiment may be implemented through combination or modification of other example embodiments by those skilled in the art. Therefore, content associated with the combination and modification should be construed as being within the scope of the present disclosure. It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting diode (OLED) device, comprising:
   a flexible substrate including a plurality of sub-pixels;
   a thin film transistor (TFT) in each of the plurality of sub-pixels, wherein the TFT includes a source electrode and a drain electrode;
   a passivation layer on the TFT;
   a planarization layer on the passivation layer;
   an organic light emitting diode on the planarization layer and including a first electrode, an organic light emitting layer and a second electrode;
   a bank on the planarization layer and disposed at a boundary region of the sub-pixel;
   a metal layer between the passivation layer and the flexible substrate and overlapping at least a portion of the first electrode and at least a portion of the bank, wherein the metal layer is disposed at the same layer as the source electrode and the drain electrode;
   an encapsulation layer on an organic light emitting diode, wherein the encapsulation layer includes at least one organic encapsulation layer and at least one inorganic encapsulation layer; and
   a touch electrode on the encapsulation layer overlapping at least a portion of the bank,
   wherein the first electrode is directly connected to the drain electrode and overlaps at least a portion of the metal layer.

2. The OLED device of claim 1, wherein the TFT has at least one inorganic layer.

3. The OLED device of claim 2, further comprising:
an opening exposing the inorganic layer of the TFT,
wherein the encapsulation layer includes at least one organic encapsulation layer and at least one inorganic encapsulation layer.

4. The OLED device of claim 3, wherein the opening connects the at least one inorganic encapsulation layer with the inorganic layer of the TFT or the passivation layer.

5. The OLED device of claim 3, wherein the opening defines at least one area in a bending region for reducing stress caused by bending the OLED device.

6. The OLED device of claim 5, wherein the area includes at least one sub-pixel.

7. The OLED device of claim 5, wherein the area is encapsulated by an inorganic material.

8. The OLED device of claim 1, further comprising:
a touch driving portion at a non-display region other than a bezel region,
wherein the touch driving portion is configured to supply a touch input driving signal to the touch electrode through the first signal line, and
wherein the touch electrode is configured to supply a touch input sensing signal to the touch driving portion through the first signal line.

9. The OLED device of claim 7, wherein the first signal line is a data line.

10. The OLED device of claim 7, wherein a driving power is configured to be supplied to the touch electrode through the first signal line.

11. The OLED device of claim 3, further comprising a filling member on the at least one inorganic encapsulation layer and filling the opening.

12. The OLED device of claim 1, wherein the TFT further includes a gate electrode and a semiconductor layer, and the semiconductor layer is formed of an amorphous silicon, a polycrystalline silicon, or an oxide semiconductor material.

13. The OLED device of claim 1, further comprising:
an opening exposing the inorganic layer of the TFT,
wherein the opening overlaps at least a portion of the metal layer.

14. The OLED device of claim 1, further comprising:
a spacer on the bank.

15. The OLED device of claim 1, wherein the flexible substrate includes a folding axis in a region including the plurality of sub-pixels.

16. The OLED device of claim 15, wherein the flexible substrate includes a first display region and a second display region, and the first and second display regions are divided from each other with respect to the folding axis.

17. The OLED device of claim 1, wherein the second electrode is not presented in the opening.

18. An organic light emitting diode (OLED) device, comprising:
a flexible substrate;
a thin film transistor (TFT) on the flexible substrate including a semiconductor layer, a gate electrode, a source electrode and a drain electrode;
a passivation layer covering the TFT;
a planarization layer on the passivation layer;
an organic light emitting diode on the planarization layer and including a first electrode, an organic light emitting layer and a second electrode;
a bank on the planarization layer and surrounding the organic light emitting diode; and
an encapsulation layer on the organic light emitting diode,
wherein an encapsulation hole is in the encapsulation layer to expose a part of the passivation layer,
wherein a touch electrode is on the exposed part of the passivation layer and extends from the drain electrode,
wherein the TFT has at least one inorganic layer,
wherein an opening is disposed to expose the inorganic layer of the TFT,
wherein the opening defines at least one area in a bending region for reducing stress caused by bending the OLED device, and
wherein the encapsulation layer includes at least one organic encapsulation layer and at least one inorganic encapsulation layer.

19. The OLED device of claim 18, wherein the semiconductor layer is formed of an amorphous silicon, a polycrystalline silicon, or an oxide semiconductor material.

20. The OLED device of claim 18, wherein the encapsulation layer includes a first encapsulation layer and a second encapsulation layer with at least one organic layer between the first and second encapsulation layers.

21. The OLED device of claim 18, further comprising:
a multi-buffer layer on the first substrate; and
an active buffer layer on the multi-buffer layer and below the TFT;
wherein
the encapsulation hole is located at removed parts of the encapsulation layer, the bank, and the planarization layer, thereby exposing the part of the passivation layer.

22. The OLED device of claim 18, wherein the passivation layer has an island pattern on each of a source electrode and the drain electrode of the TFT.

23. The OLED device of claim 18, further comprising:
a touch driving portion at a non-display region other than a bezel region,
wherein the touch driving portion is configured to supply a touch input driving signal to the touch electrode through the first signal line, and
wherein the touch electrode is configured to supply a touch input sensing signal to the touch driving portion through the first signal line.

24. The OLED device of claim 23, wherein the first signal line is a data line.

25. The OLED device of claim 23, wherein a driving power is configured to be supplied to the touch electrode through the first signal line.

26. The OLED device of claim 18, wherein the flexible substrate including a plurality of sub-pixels, and the bank includes an opening corresponding to each of the plurality of sub-pixels,
wherein the organic light emitting diode is disposed in the opening of each of the plurality of sub-pixels, and the encapsulation hole is positioned between adjacent openings.

* * * * *